US011451696B2

(12) United States Patent
Kwon et al.

(10) Patent No.: US 11,451,696 B2
(45) Date of Patent: Sep. 20, 2022

(54) IMAGE SENSOR FOR CAMERA DEVICE AND FOR ELECTRONIC DEVICE

(71) Applicant: SAMSUNG ELECTRONICS CO., LTD., Suwon-si (KR)

(72) Inventors: Kihyun Kwon, Seoul (KR); Gunwoo Ryu, Hwaseong-si (KR); Euncheol Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 143 days.

(21) Appl. No.: 16/914,389

(22) Filed: Jun. 28, 2020

(65) Prior Publication Data

US 2021/0120160 A1     Apr. 22, 2021

(30) Foreign Application Priority Data

Oct. 18, 2019  (KR) .................. 10-2019-0129618

(51) Int. Cl.
*H04N 5/232*     (2006.01)
*H04N 1/00*      (2006.01)
*H04N 5/225*     (2006.01)

(52) U.S. Cl.
CPC ......... *H04N 5/232* (2013.01); *H04N 1/00095* (2013.01); *H04N 5/2253* (2013.01); *H04N 2201/0084* (2013.01)

(58) Field of Classification Search
None
See application file for complete search history.

(56) References Cited

U.S. PATENT DOCUMENTS

| 9,350,403 | B2   |   | 5/2016  | Yu et al.                     |
|-----------|------|---|---------|-------------------------------|
| 9,578,267 | B2   | * | 2/2017  | Slovick ............... H04N 5/378 |
| 9,606,954 | B2   |   | 3/2017  | Marena et al.                 |
| 9,755,818 | B2   |   | 9/2017  | Sengoku                       |
| 10,204,964| B1   | * | 2/2019  | Lee ................ H01L 27/14689 |
| 10,567,688| B2   | * | 2/2020  | Lee .................... H04N 5/341 |
| 2006/0187327 | A1 | * | 8/2006  | Mabuchi ............ H01L 27/1464 |
|           |      |   |         | 348/294                       |
| 2006/0220673 | A1 | * | 10/2006 | Hiranuma ............ H01L 23/50 |
|           |      |   |         | 326/27                        |

(Continued)

FOREIGN PATENT DOCUMENTS

JP       05090559  A  *  4/1993  ............. H01L 27/14

OTHER PUBLICATIONS

JP-05090559A; Yamaguchi, Kazufumi; Contact Image Sensor; Apr. 1993; English Translation; p. 1 (Year: 1993).*

*Primary Examiner* — Cynthia Segura
(74) *Attorney, Agent, or Firm* — F. Chau & Associates, LLC

(57) ABSTRACT

A semiconductor memory device includes a pixel array having pixels, a logic circuit configured to process a signal output by the pixels to generate image data, and sensor pads connected to the logic circuit, where the sensor pads include a first ground sensor pad, a second ground sensor pad, signal sensor pads disposed between the first ground sensor pad and the second ground sensor pad and configured to output the image data, and dummy sensor pads disposed between the first ground sensor pad and the second ground sensor pad and configured not to output the image data, and at least one of the dummy sensor pads is disposed between the signal sensor pads.

20 Claims, 27 Drawing Sheets

(56) References Cited

U.S. PATENT DOCUMENTS

| | | | |
|---|---|---|---|
| 2007/0284448 A1* | 12/2007 | Wang | G06K 7/10722 |
| | | | 235/462.45 |
| 2011/0050874 A1* | 3/2011 | Reshef | H04N 5/378 |
| | | | 348/65 |
| 2012/0307030 A1* | 12/2012 | Blanquart | H01L 27/146 |
| | | | 348/76 |
| 2012/0326764 A1 | 12/2012 | Boomer et al. | |
| 2013/0264465 A1* | 10/2013 | Dai | H01L 27/14601 |
| | | | 250/208.1 |
| 2013/0264466 A1* | 10/2013 | Dai | H04N 5/369 |
| | | | 250/208.1 |
| 2014/0077063 A1* | 3/2014 | Cho | H01L 27/14634 |
| | | | 250/208.1 |
| 2015/0109504 A1* | 4/2015 | Sakuragi | H01L 27/14634 |
| | | | 348/302 |
| 2016/0073498 A1* | 3/2016 | Yeo | H05K 1/111 |
| | | | 361/748 |
| 2017/0032757 A1 | 2/2017 | Itoigawa et al. | |
| 2017/0117979 A1 | 4/2017 | Sengoku et al. | |
| 2017/0245360 A1* | 8/2017 | Jung | H04M 1/0264 |
| 2017/0286327 A1 | 10/2017 | Zhang et al. | |
| 2018/0007226 A1* | 1/2018 | Holland | G06F 13/18 |
| 2019/0188159 A1 | 6/2019 | Song et al. | |
| 2020/0344384 A1* | 10/2020 | Somei | H01L 27/14618 |
| 2020/0373341 A1* | 11/2020 | Jo | H01L 24/48 |
| 2022/0139992 A1* | 5/2022 | Ito | H04N 5/361 |
| | | | 257/432 |

* cited by examiner

IMAGE SENSOR FOR CAMERA DEVICE AND FOR ELECTRONIC DEVICE

CROSS-REFERENCE TO RELATED APPLICATION

This application claims priority under 35 U.S.C. § 119 to Korean Patent Application No. 10-2019-0129618, filed on Oct. 18, 2019, in the Korean Intellectual Property Office, the disclosure of which is incorporated herein by reference in its entirety.

TECHNICAL FIELD

The present disclosure relates to image sensors, and more particularly relates to an image sensor configurable for multiple device interfaces, including a camera device interface, and an electronic device interface.

DISCUSSION OF RELATED ART

An image sensor is a semiconductor-based sensor for receiving light and generating an electrical signal, and may include a pixel array including a plurality of pixels, a logic circuit for driving the pixel array and generating an image, and the like. The plurality of pixels may include a photodiode reacting with light to generate electrical charges, and a pixel circuit for outputting a pixel signal using the electrical charges generated by the photodiode. The image sensor may generate image data from the pixel signal and may transmit the image data to an external processor.

SUMMARY

An example embodiment provides an image sensor, in which pads, capable of corresponding to a plurality of interfaces, are implemented to transmit image data to the plurality of interfaces without an additional change in design, a camera device including the image sensor, and an electronic device including the image sensor.

According to an example embodiment, a semiconductor-based image sensor includes a pixel array having pixels, a logic circuit configured to process a signal output by the pixels to generate image data, and sensor pads connected to the logic circuit. The sensor pads include a first ground sensor pad, a second ground sensor pad, signal sensor pads disposed between the first ground sensor pad and the second ground sensor pad and configured to output the image data, and dummy sensor pads disposed between the first ground sensor pad and the second ground sensor pad and configured not to output the image data. At least one of the dummy sensor pads may be disposed between the signal sensor pads.

According to an example embodiment, a camera device includes a sensor module including an image sensor having sensor pads, a first substrate on which the image sensor is mounted, a connector including a second substrate, connected to the sensor module, and connection pads connected to the second substrate. The connection pads include a first ground connection pad, a second ground connection pad, signal connection pads disposed between the first ground connection pad and the second ground connection pad and configured to output image data output by the image sensor, and a dummy connection pad configured not to output the image data. The number of the sensor pads is equal to the number of the connection pads, and the sensor pads and the connection pads are electrically connected in one-to-one correspondence.

According to an example embodiment, an electronic device includes a camera device including an image sensor having sensor pads, a module substrate on which the image sensor is mounted, and a connector having connection pads connected to the sensor pads, the sensor pads including signal sensor pads, outputting image data output by the image sensor and dummy sensor pads between the signal sensor pads, and a processor connected to the camera device through the connector to communicate with the camera device and configured to receive the image data from the camera device based on a first interface or a second interface. The image sensor determines a first pad among the sensor pads to be one of the signal sensor pads and a second pad, different from the first pad, to be one of the dummy sensor pads in the first interface, and determines the first pad to be one of the dummy sensor pads and the second pad to be one of the signal sensor pads in the second interface.

BRIEF DESCRIPTION OF DRAWINGS

The above and other aspects, features, and details of the present disclosure will be more clearly understood from the following detailed description, taken in conjunction with the accompanying drawings, in which.

DETAILED DESCRIPTION

Hereinafter, example embodiments will be described with reference to the accompanying drawings.

Figure 1A:
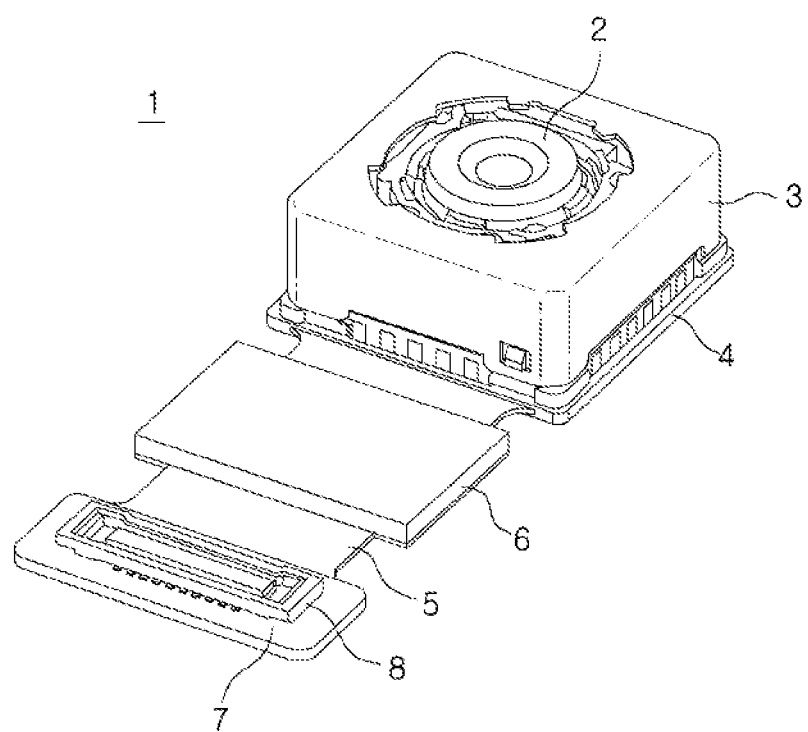
FIGS. 1A and 1B are schematic diagrams of a camera device including an image sensor according to an example embodiment.
Figure 1B:
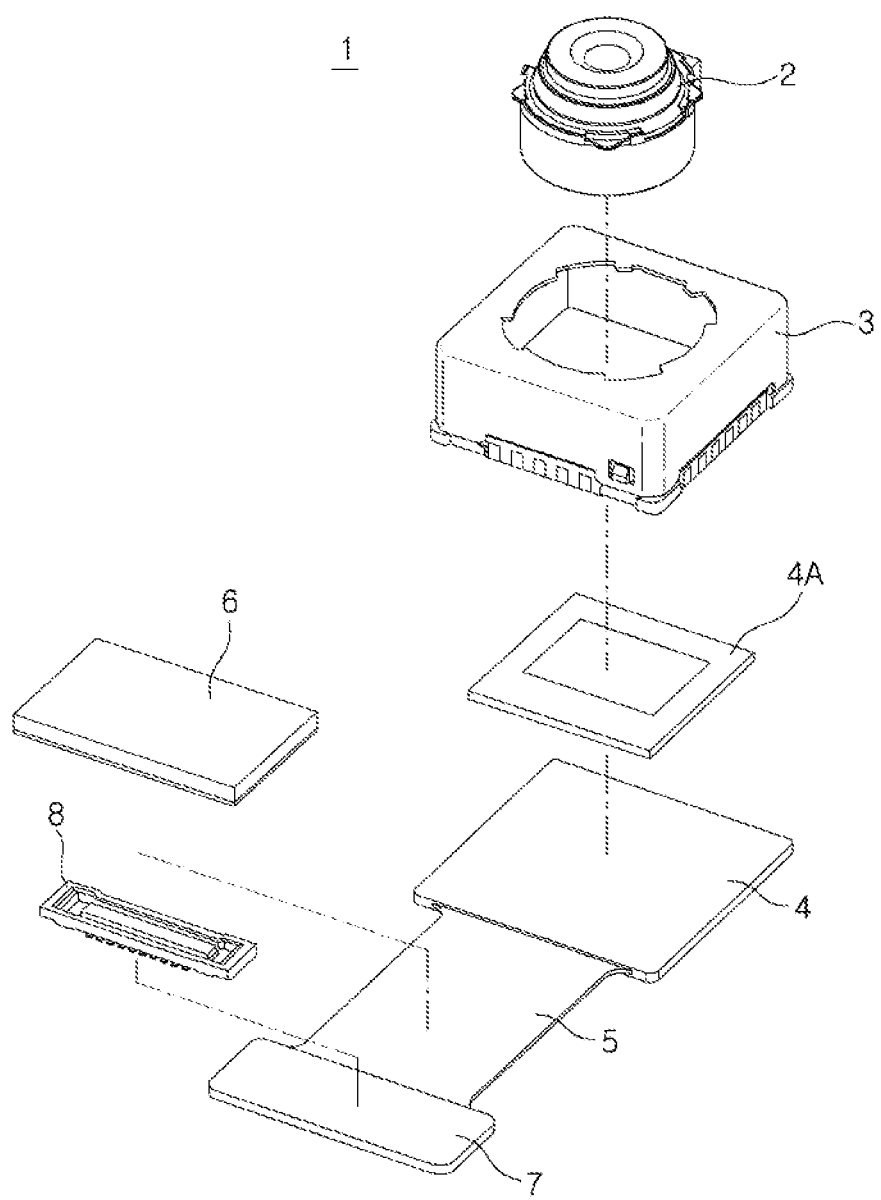

FIGS. 1A and 1B illustrate a camera device including an image sensor according to an example embodiment.

Referring to FIGS. 1A and 1B, a camera device 1 according to an example embodiment may include an image sensor 4A capturing a subject to generate image data.

The camera device 1 may include an optical unit 2, a housing 3 accommodating the optical unit 2, the image sensor 4A, and the like, a first substrate 4 on which the image sensor 4A is mounted, a second substrate 5 connected to the first substrate 4, an image processor 6, a third substrate 7 connected to the second substrate 5, a connector 8, and the like. The image processor 6 may be mounted on the second substrate 5, and the connector 8 may be mounted on the third substrate 7. The first substrate 4, the second substrate 5, and the third substrate 7 may provide a module substrate. An exterior of the camera device 1 may be modified to be different from the example illustrated in FIGS. 1A and 1B.

The optical unit 2 may include at least one lens for converging light to capture the subject. The image sensor 4A may move the lens, included in the optical unit 2, to focus on the subject, and the lens may be moved by an AF generator mounted on inside of the housing 3.

The image sensor 4A is disposed below the optical unit 2 and may be mounted on the first substrate 4. The image sensor 4A may include a plurality of pixels, a logic circuit for generating image data using an electrical signal output by the plurality of pixels, and the like. Each of the plurality of pixels may include a photoelectric element for generating charges in response to light, a pixel circuit for converting the charges generated by the photoelectric element into an electrical signal, and the like. In an example embodiment, the image sensor 4A may include a memory connected to the logic circuit to store image data.

The second substrate 5, connected to the first substrate 4 and the third substrate 7, may be a flexible printed circuit board (FPCB). The image processor 6 may be mounted on the second substrate 5, and the third substrate 7 may be connected to one end of the second substrate 5. A connector 8 may be disposed on the third substrate 7 to provide a connection to an external processor, or the like. The image processor 5 may include a circuit for processing image data, and the like. The camera device 1 may exchange data with an external device such as a central processing unit (CPU), an application processor (AP), a display driver, or the like, through the connector 8.

The camera device 1 may exchange data with an external device through a predetermined interface. For example, the camera device 1 may exchange data with an external device according to one of a D-PHY interface and a C-PHY interface defined in the mobile industry processor interface (MIPI) standard. The D-PHY interface and the C-PHY interface may transmit data in different manners than each other, and the numbers and placements of pads required for the D-PHY interface and the C-PHY interface to transmit data may also be different than each other. Accordingly, when an interface required by the external device is one of D-PHY or C-PHY, for example, the connector 8, the third substrate 7, the image processor 6, the second substrate 5 and/or the first substrate 4 may be selected accordingly, but the same image sensor 4A may be used in either instance. Thus, the image sensor 4A may provide a plurality of interfaces In an example embodiment, the camera device 1 may provide a plurality of interfaces. At least one of the image sensor 4A, the first substrate 4, the second substrate 5, the third substrate 7, and the connector 8 may include pads capable of providing a plurality of interfaces. When the external device and the connector 8 are connected to each other, the image sensor 4A may determine at least a portion of the pads as signal pads and the other pads as dummy pads. That is, the image sensor may provide the type of signals required by the interface specification of the currently connected external device, such as differential or single-ended signals; the image sensor or the camera device may configure transmitters and/or transmitter pads accordingly, and the image sensor or the camera device or the processor may configure receiver pads and/or receivers accordingly. The numbers and placements of the signal pads and the dummy pads may vary based on an interface required by the currently connected external device.

Figure 2:
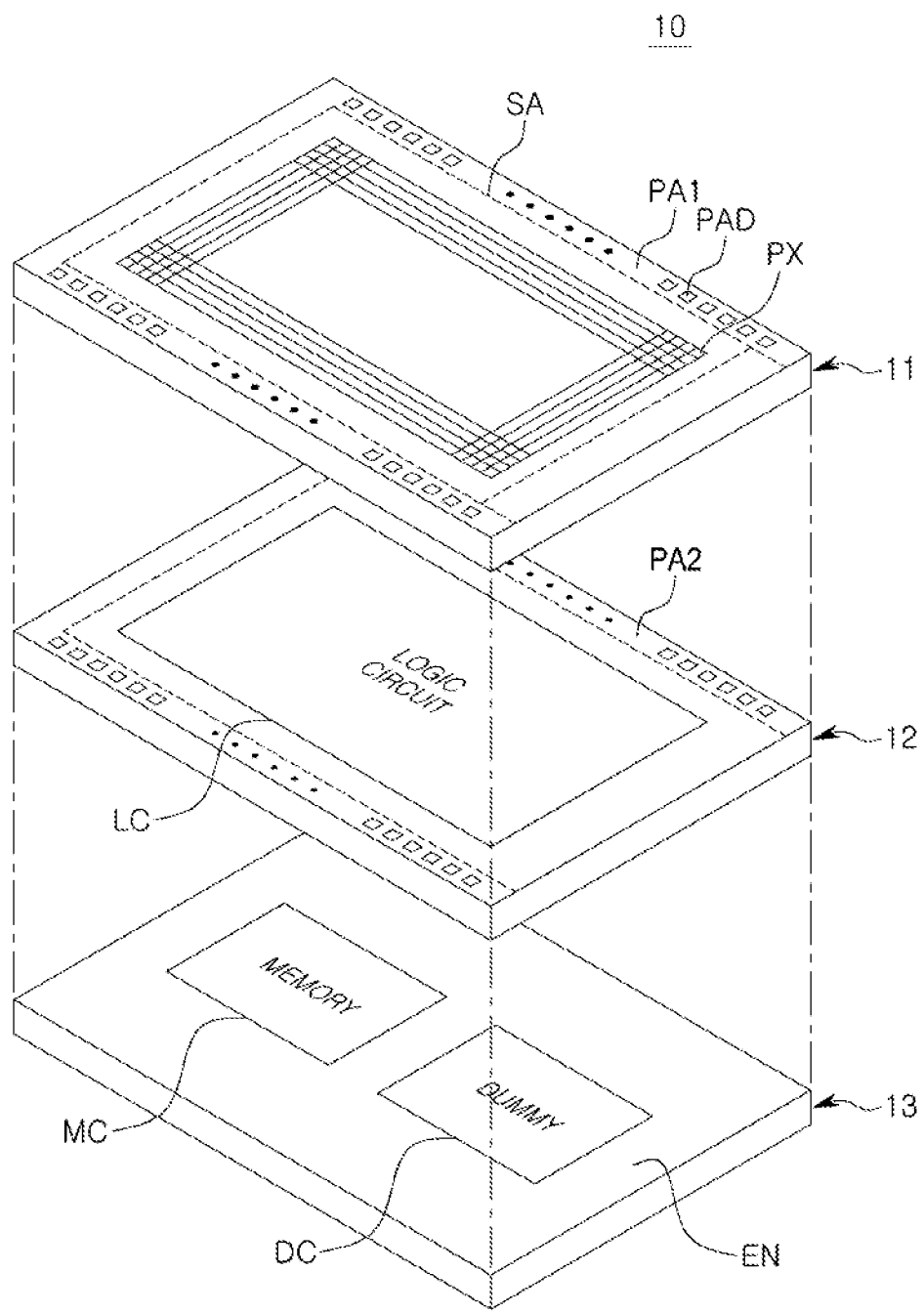
FIGS. 2 and 3 are schematic diagrams of image sensors according to example embodiments, respectively.
Figure 3:
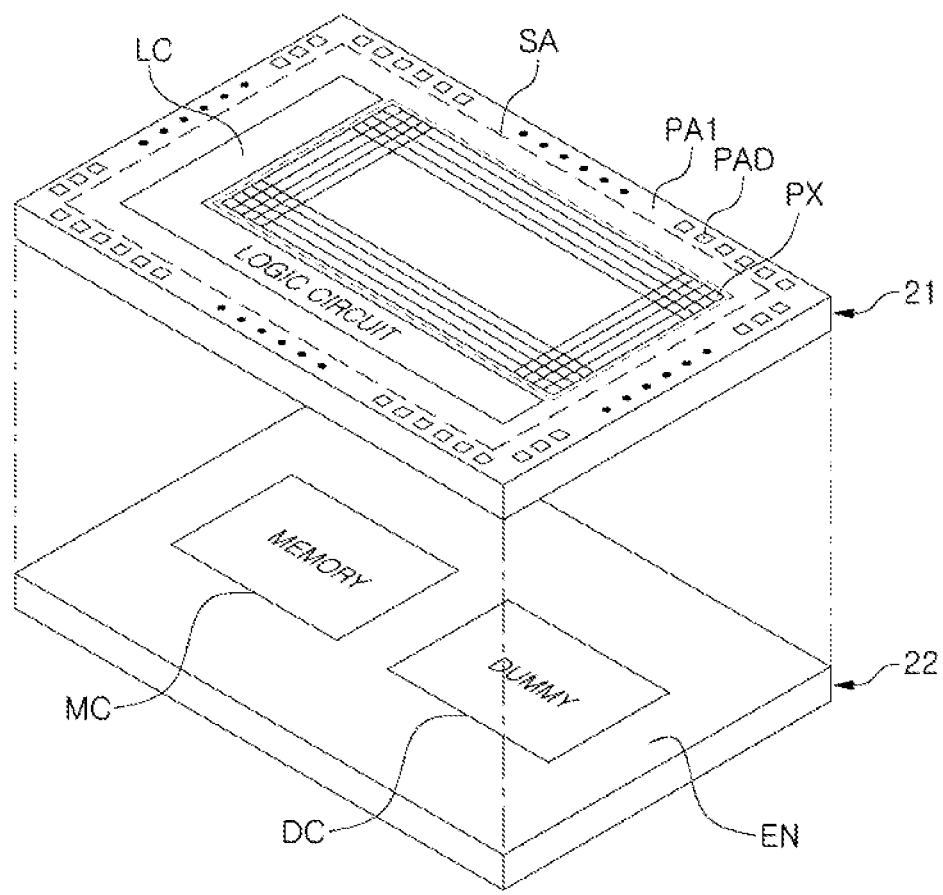

FIGS. 2 and 3 illustrate image sensors according to example embodiments, respectively.

Referring to FIG. 2, an image sensor 10 according to an example embodiment may include a first layer 11, a second layer 12 provided below the first layer 11, a third layer 13 provided below the second layer 12, or the like. The first layer 11, the second layer 12, and the third layer 13 may be stacked in a direction perpendicular to each other. In an example embodiment, the first layer 11 and the second layer 12 may be stacked on each other at a wafer level, and the third layer 13 may be attached to a lower portion of the second layer 12 at a chip level. The first to third layers 11 to 13 may be provided in a single package.

The first layer 11 may have a sensing area SA, provided with a plurality of pixels PX, and a first pad area PA1 provided around the sensing area SA. The first pad area PA1 may include a plurality of first pads PAD, and the plurality of first pads PAD may be connected to a plurality of second pads provided in a second pad area PA2 and to a logic circuit LC, each of the second layer 12, through vias or the like.

The second layer 12 may include a plurality of elements for providing a logic circuit LC. The plurality of elements included in the logic circuit LC may include circuits for driving a pixel circuit of each of the pixels PX provided in the first layer 11, such as, for example, a row driver, a column driver, a readout circuit, a timing controller, or the like. The plurality of elements, included in the logic circuit LC, may be connected to the pixels PX through the first and second pad areas PA1 and PA2. The logic circuit LC may obtain a pixel signal from the pixels PX.

In an example embodiment, at least one of the pixels PX may include a plurality of photodiodes disposed on the same level. Pixel signals, generated from charges of each of the plurality of photodiodes, may have a phase difference from each other, and the logic circuit LC may provide an auto-focusing (AF) function based on the phase difference of the pixel signals generated from a plurality of photodiodes included in a single pixel PX.

The third layer 50, provided below the second layer 12, may include a memory layer MC, a dummy chip DC, and an encapsulation layer EN encapsulating the memory chip MC and the dummy chip DC. The memory chip MC may be a dynamic random-access memory (DRAM) or a static random-access memory (SRAM), and the dummy chip DC need not have a function to actually store data. The memory chip MC may be electrically connected to at least a portion of the elements, included in the logic circuit LC of the second layer 12, by bumps and may store data required to provide an autofocus function. In an example embodiment, the bump may be a microbump.

Referring to FIG. 3, an image sensor 20 according to an example embodiment may include a first layer 21 and a second layer 22. The first layer 21 has a sensing area SA in which a plurality of pixels PX are provided, a logic circuit LC in which elements for driving the plurality of pixels PX are provided, and a first pad area PA1 provided around the sensing area SA and the logic circuit LC. The first pad area PA1 includes a plurality of pads PAD, and the plurality of pads PAD may be connected to pads of a substrate on which the image sensor 20 is mounted. The logic circuit LC may be connected to the memory chip MC provided in the second layer 22 through a via or the like. The second layer 22 may include a memory chip MC, a dummy chip DC, and an encapsulation layer EN encapsulating the memory chip MC and the dummy chip DC.

Figure 4:
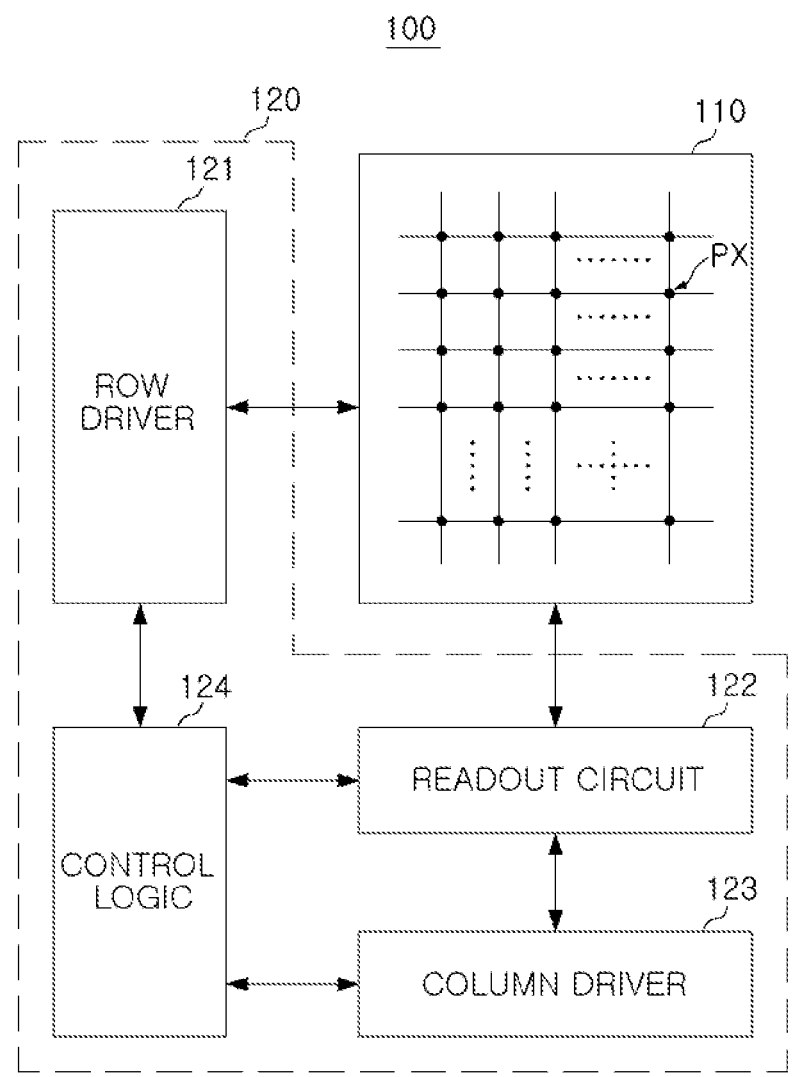
FIG. 4 is a schematic block diagram of an image sensor according to an example embodiment.

FIG. 4 illustrates an image sensor according to an example embodiment.

Referring to FIG. 4, an image sensor 100 according to an example embodiment may include a pixel array 110 and a logic circuit 120. The logic circuit 120 may include a row driver 121, a readout circuit 122, a column driver 123, control logic 124, and the like.

The image sensor 100 may convert externally received light into an electrical signal to generate image data. The pixel array 110, included in the image sensor 100, may include a plurality of pixels PX, and each of the plurality of pixels PX may include a photoelectric element, such as, for example, a photodiode PD, for receiving light to generate charges. The plurality of pixels PX may be connected to a plurality of row lines extending in a first direction, and a plurality of column lines extending in a second direction. In an example embodiment, each of the plurality of pixels PX may generate a pixel signal corresponding to light having various colors, or two or more photodiodes may be included in each of the plurality of pixels PX to provide an autofocusing function.

Each of the plurality of pixels PX may include a pixel circuit for generating a pixel signal from charges generated by photodiodes. In an example embodiment, the pixel circuit may include a transfer transistor, a drive transistor, a select transistor, a reset transistor, a floating diffusion region, or the like. The pixel circuit may output a reset voltage and a pixel voltage. The pixel voltage may be a voltage corresponding to a charge generated by the photodiodes, included in each of the plurality of pixels PX, and stored in the floating diffusion region. In an example embodiment, two or more pixels PX adjacent to each other may constitute a single pixel group, and two or more pixels PX, included in the pixel group, may share a portion of a transfer transistor, a drive transistor, a select transistor, and a reset transistor with each other.

The row driver 121 may input a drive signal to a plurality of row lines. For example, the drive signal may include a transfer control signal to control the transfer transistor of the pixel circuit, a reset control signal to control the reset transistor of the pixel circuit, a select control signal to control the select transistor of the pixel circuit, and the like. For example, the row driver 121 may sequentially drive the plurality of row lines.

The readout circuit 122 may include a sampling circuit, an analog-to-digital converter ADC, and the like. The sampling circuit may include a plurality of samplers connected to pixels PX through a plurality of column lines. In an example embodiment, the sample circuit may be a correlated double sampler (CDS). The sampler may detect a reset voltage and a pixel voltage from a pixel PX connected to a selected row line driven by the row driver 121 among the plurality of row lines. The samplers may compare each of the reset voltage and the pixel voltage with a ramp voltage to output a comparison result. The analog-to-digital converter ADC may convert the comparison result, output by the sampler, into a digital signal and may output the digital signal.

The column driver 123 may include a latch and an amplifier circuit which may temporarily store and process the digital signal received from the readout circuit 122. The row driver 121, the readout circuit 122, and the column driver 123 may be controlled by the control logic 124. The control logic 124 may include a timing controller for controlling operation timings of the row driver 121, the readout circuit 122, and the column driver 123, an image signal processor for processing image data, and the like, but is not limited thereto. According to embodiments, the image signal processor may be included in an external processor connected to communicate with the image sensor 100.

The logic circuit 120 may generate image data using digital signals obtained from the pixel array 110, and may output image data through a plurality of pads included in the image sensor 100. For example, the image data may be output according to a predetermined interface, and the number and placement of pads required to output the image data may vary based on the interface.

In an example embodiment, the image sensor 100 may support a plurality of interfaces. When the image sensor 100 is connected to an external processor or the like and receives a control command for setting an interface, the logic circuit may set each of the pads as a signal pad or a dummy pad according to the control command. The number and placement order of signal pads and dummy pads may vary based on a control command transmitted by a processor, and one image sensor 100 may support a plurality of interfaces. Thus, versatility and expandability of the image sensor 100 may be extended.

Figure 5:
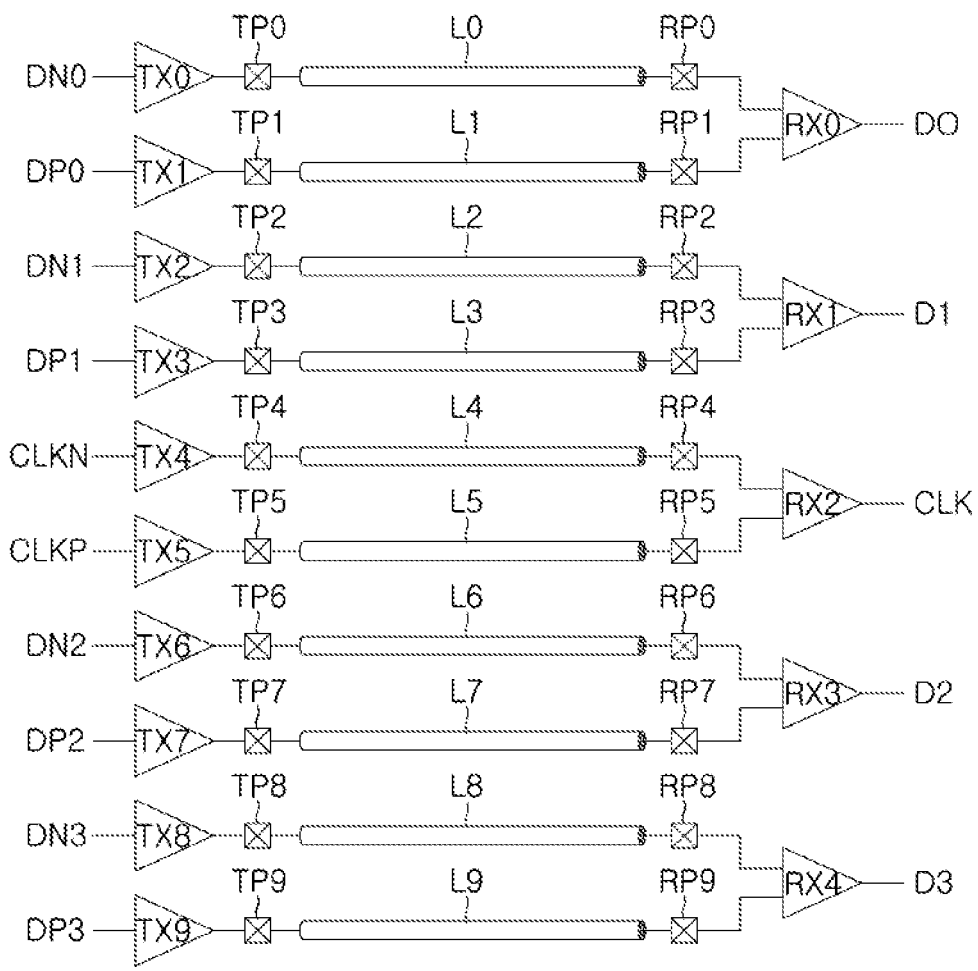
FIGS. 5 and 6 are circuit diagrams illustrating interfaces of an image sensor according to example embodiments, respectively.
Figure 6:
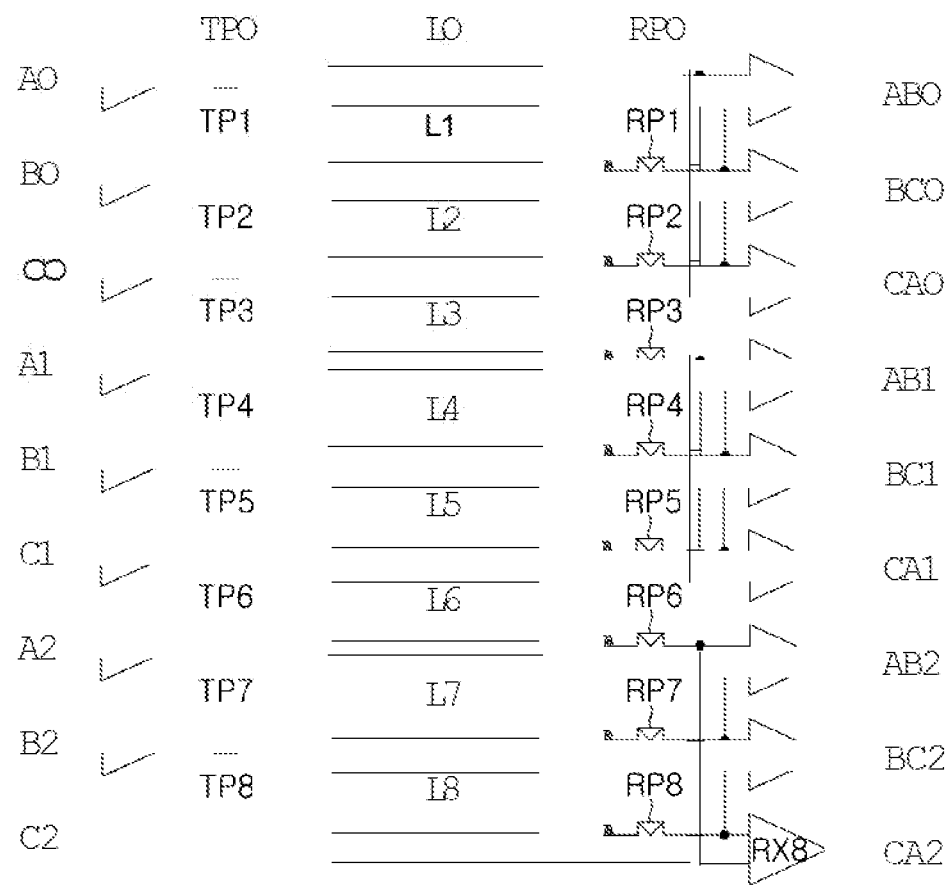

FIGS. 5 and 6 illustrate interfaces of an image sensor according to example embodiments, respectively.

FIG. 5 illustrates operations of an interface for outputting image data and a clock signal in a differential signal scheme, such as, for example, a D-PHY interface according to the MIPI standard. Referring to FIG. 5, a plurality of transmitters TX0 to TX9 may output image data DN0 to DN3 and DP0 to DP3 and clock signals CLKN and CLKP through a plurality of transmitter pads TP0 to TP9.

The transmitter pads TP0 to TP9 may be connected to the plurality of receiver pads RP0 to RP9 through the plurality of data lanes L0 to L9, and the receiver pads RP0 to RP9 may be connected to a plurality of receivers RX0 to RX4. As an example, the receiver pads RP0 to RP9 may be pads provided in a main substrate on which the processor is mounted, or the like. Each of the receivers RX0 to RX4 may be connected to a pair of receiver pads RP0 to RP9, and may generate data D0 to D3 and a clock signal CLK in a differential signaling scheme. Accordingly, in the example embodiment illustrated in FIG. 5, ten transmitter pads TP0 to TP9, ten data lanes L0 to L9, and ten receiver pads RP0 to RP9 may be required to transmit image data in a differential signaling scheme. According to example embodiments, dummy pads may be added to achieve an electrical shielding effect.

FIG. 6 illustrates operations of an interface for outputting image data in a single-ended signaling scheme, such as, for example, a C-PHY interface according to the MIPI standard. Referring to FIG. 6, a plurality of transmitters TX0 to TX8 may output data A0 to C0, A1 to C1, and A2 to C2 through a plurality of transmitter pads TP0 to TP8. Since the image data is output in the single-ended signaling scheme, an additional data lane for outputting a clock signal need not exist in an interface according to the example embodiment illustrated in FIG. 6.

The transmitter pads TP0 to TP8 may be connected to a plurality of receiver pads RP0 to RP8 through a plurality of data lanes L0 to L8, and the receiver pads RP0 to RP8 may be connected to a plurality of receivers RX0 to RX8. For example, the receiver pads RP0 to RP9 may be pads provided in a main substrate on which the processor is mounted, or the like. The transmitter pads TP0 to TP8 may be divided into a plurality of groups TP0 to TP2, TP3 to TP5, and TP6 to TP8 according to data A0 to C0, A1 to C1, and A2 to C2. The receiver pads RP0 to RP8 may also be divided into a plurality of groups RP0 to RP2, RP3 to RP5, and RP6 to RP8. Each of the receivers RX0 to RX8 may receive a pair of receiver pads among the receiver pads RP0 to RP8 included in each of the groups RP0 to RP2, RP3 to RP5, and RP6 to RP8. As an example, the first receiver RX0 may output a difference between the signal A0 and the signal B0, and the second receiver RX1 may output a difference between the signal B0 and the signal C0. In addition, the third receiver RX2 may output a difference between the signal C0 and the signal A0.

In the example embodiment illustrated in FIG. 6, nine transmitter pads TP0 to TP8, nine data lanes L0 to L8, and nine receiver pads RP0 to RP8 may be required to transmit image data in a single-ended signaling scheme. However, even in the single-ended signaling scheme, according to example embodiments, dummy pads may be added to achieve an electrical shielding effect.

For example, the number of pads required by interfaces of the differential signaling scheme may be different from the number of pads required by interfaces of the single-ended signaling scheme. Accordingly, when wiring of pads of an image sensor and a module substrate, on which the image sensor is mounted, as designed, the image sensor and/or a camera device need not be connected to a processor receiving the image data according to another interface.

In an example embodiment, a plurality of interfaces, outputting image data in different schemes to each other, may all be supported using pads disposed in an image sensor and/or a camera device. Accordingly, a versatily applicable image sensor and camera device may be provided, irrespective of type of interface required by a processor receiving image data FIG. 7 illustrates a sensor module including an image sensor according to an example embodiment.

Figure 7:
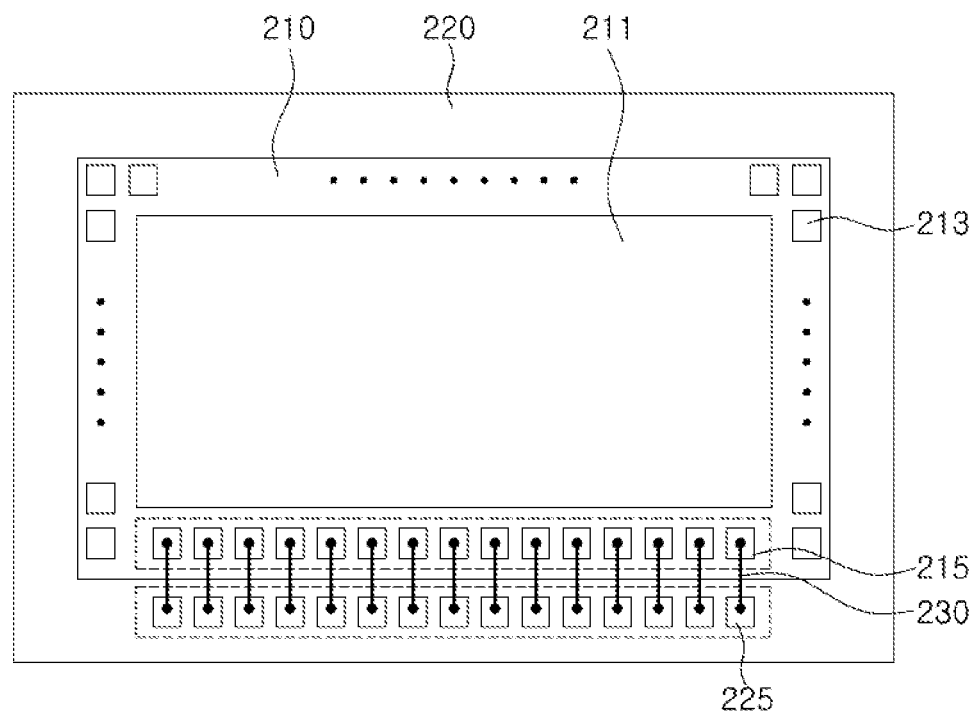
FIG. 7 is a schematic diagram of a sensor module including an image sensor according to an example embodiment.

Referring to FIG. 7, a sensor module 200 according to an example embodiment may include an image sensor 210, a first substrate 220 on which the image sensor 210 is mounted, and the like. The image sensor 210 may have a sensing area 211 in which pixels are disposed, and a plurality of sensor pads 213 may be disposed around the sensing area 211. In the example embodiment illustrated in FIG. 7, a logic circuit, obtaining a pixel signal from pixels included in the sensing area 211 to output image data, may be disposed below the sensing area 211. As an example, the sensor pads 213 may be connected to a logic circuit.

The plurality of sensor pads 213, disposed around the sensing area 211, may include sensor pads 215 connected to substrate pads 225 formed on a first substrate 220. The sensor pads 215 may be connected to the substrate pads 225 of the first substrate 220 by a wire 230 or the like. However, a manner of connecting of the sensor pads 215 and the substrate pads 225 is not limited to the connection by the wire 230.

In the sensor module 200 according to the example embodiment illustrated in FIG. 7, the image sensor 210 may include fifteen sensor pads 215 for outputting image data, and the first substrate 220 may also include fifteen substrate pads 225. The sensor pads 215 and the substrate pads 225 may be connected to each other in one-to-one correspondence.

The image sensor 210 may set a value of a register determining an interface for outputting image data to the external device in response to a control command received from an external device, for example, a central processing unit (CPU), an application processor (AP), or the like. In addition, the image sensor 210 may allocate at least a portion of the sensor pads 215 as signal pads, outputting the image data, and at least a portion of the sensor pads 215 as dummy pads, not outputting the image data, according to the determined interface. Hereinafter, an example of a method of allocating the sensor pads 215 as transmitter pads and dummy pads by the image sensor 210 according to interfaces will be described with reference to FIGS. 8 and 9.

Figure 8:
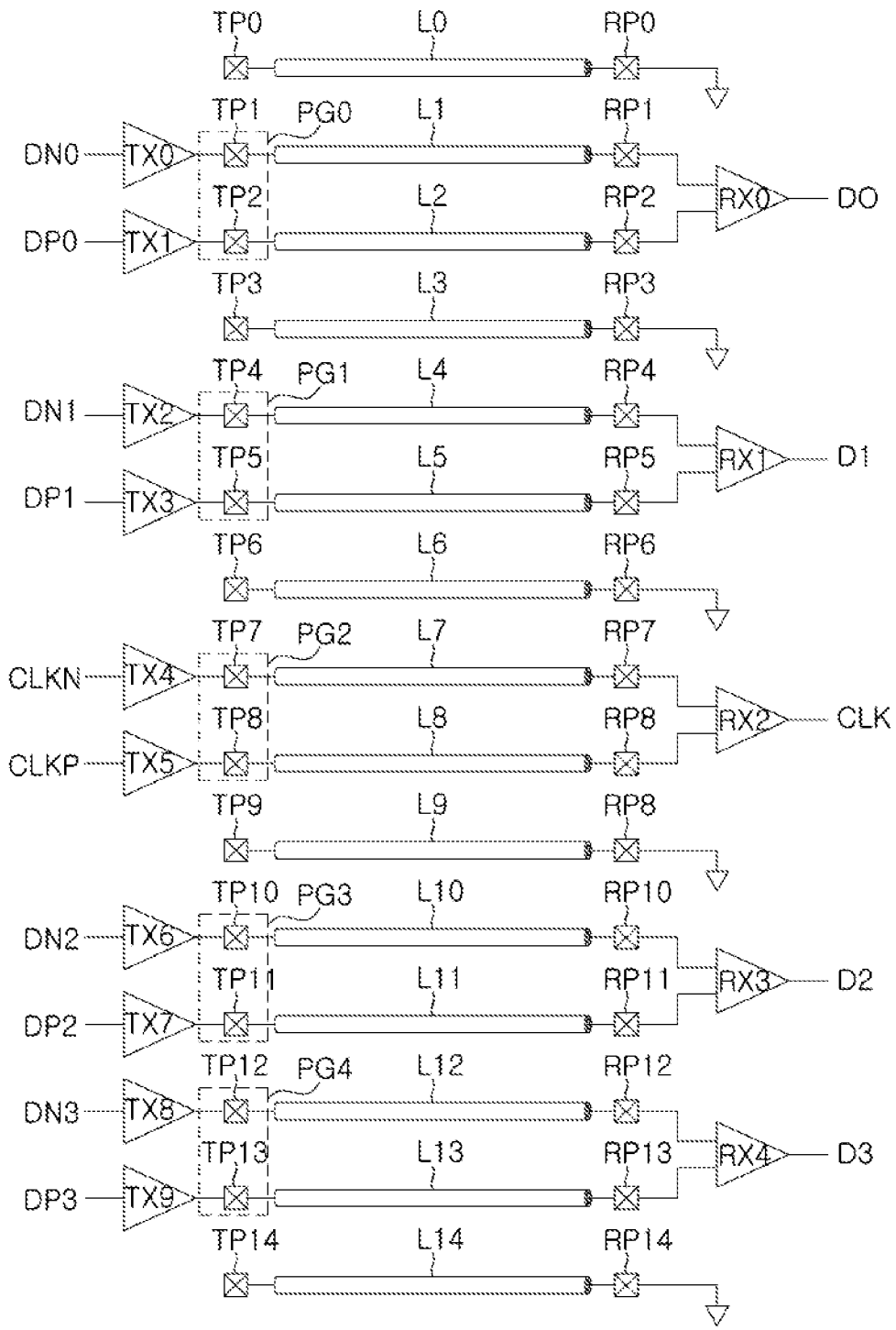
FIGS. 8 and 9 are circuit diagrams illustrating an interface supported by a camera device according to an example embodiment.
Figure 9:
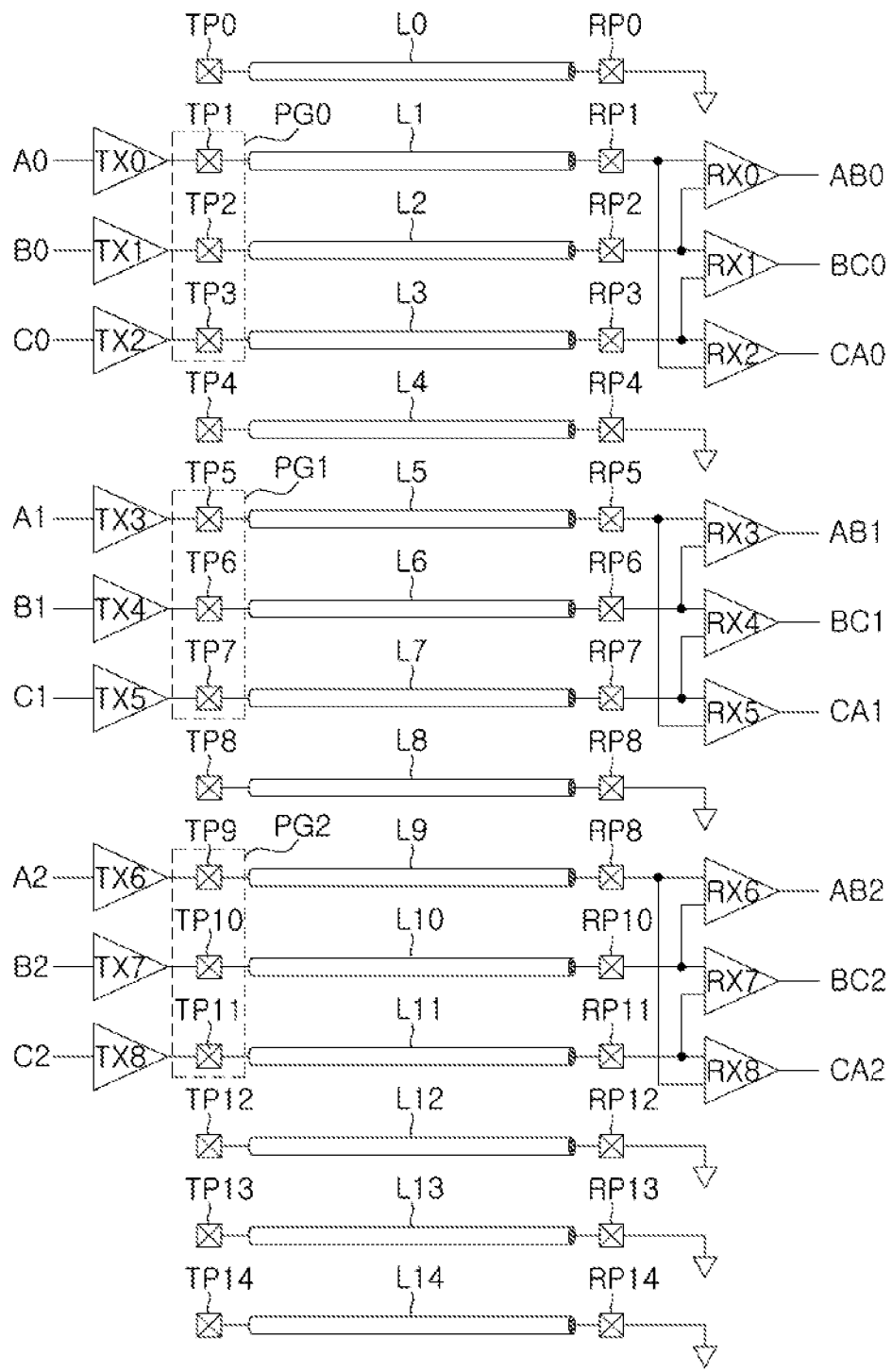

FIGS. 8 and 9 illustrate first and second interfaces supported by a camera device according to an example embodiment.

An example embodiment, illustrated in FIG. 8, may correspond to a case in which an image sensor selects a first interface for outputting image data and a clock signal in a differential signaling scheme. On the other hand, an example embodiment, illustrated in FIG. 9, may correspond to a case in which an image sensor selects a second interface for outputting image data in a single-ended signaling scheme. For example, the first interface may be a D-PHY interface, and the second interface may be a C-PHY interface.

In the example embodiment illustrated in FIGS. 8 and 9, an image sensor may be connected to a transmission side of data lanes L0 to L14 and an external device such as a central processing unit (CPU), an application processor (AP), or the like, may be connected to the reception side of the data lanes L0 to L14. Accordingly, it will be understood that the transmitter pads TP0 to TP14 on the transmission side of the data lanes L0 to L14 are connected to sensor pads formed in the image sensor in one-to-one correspondence. Hereinafter, for ease of description, the transmitter pads TP0 to TP14 will be referred to as sensor pads of the image sensor.

Referring to FIGS. 8 and 9, among the sensor pads TP0 and TP14, sensor pads PT0 and TP14 disposed on opposite ends of the sensor pads TP0 to TP14 may be allocated as a first ground sensor pad TP0 and a second ground sensor pad TP14, respectively. For example, the sensor pads TP0 and TP14, disposed on opposite ends of the sensor pads TP0 to TP14, may be connected to a ground voltage. As an example, a ground voltage for providing the first ground sensor pad TP and the second ground sensor pad TP14 may be input by an external device connected to the image sensor 210, for example, a central processing unit (CPU), an application processor (AP), or the like.

The sensor pads TP0 to TP14 may include signal sensor pads and dummy sensor pads disposed between the first ground sensor pad TP0 and the second ground sensor pad TP14. For example, at least a portion of the sensor pads TP1 to TP13, disposed between the first ground sensor pad TP0 and the second ground sensor pad TP14, may be allocated as signal sensor pads, and the other sensor pads may be allocated as dummy sensor pads. The signal sensor pads may be pads for outputting image data in a differential signaling scheme or a single-ended signaling scheme, and image data need not be output to dummy sensor pads. Similar to the ground sensor pads TP0 and TP14, the dummy sensor pads may receive a ground voltage or may be floated. The dummy sensor pads may provide an electrical shielding effect.

In the example embodiment illustrated in FIG. 8, sensor pads TP0 to TP14 may provide pad groups PG0 to PG4. To output image data and a clock signal in a differential signaling scheme, each of the pad groups PG0 to PG4 may include a pair of signal sensor pads. The pair of signal sensor pads, included in each of the pad groups PG0 to PG4, may be signal sensor pads disposed adjacent to each other. For example, the first pad group PG0 may include a pair of signal sensor pads TP1 and TP2 outputting image data in the differential signaling scheme and disposed adjacent to each other.

In the example embodiment illustrated in FIG. 8, since the image data is output in the differential signaling scheme, at least one of the pad groups PG0 to PG4 may be allocated as a clock pad group PG2 outputting a clock signal. For example, the clock signal CLK may be output in the differential signaling scheme through the clock pad group PG2. The same number of pad groups may be disposed on opposite sides of the clock pad group PG2. Referring to FIG. 8, two pad groups PG0 and PG1 may be disposed on a first side of the clock pad group PG2, and two pad groups PG3 and PG4 may be disposed on a second side opposing the first side.

The pad groups PG0 to PG4 may include a first pad group PG0 adjacent to the first ground sensor pad TP0 and a second pad group PG4 adjacent to the second ground sensor pad TP14. Since the first ground sensor pad TP0 and the second ground sensor pad TP14 may provide an electric shielding effect, additional dummy sensor pads need not be disposed between the first ground sensor pad TP0 and the first pad group PG0 and between the second ground sensor TP14 and the second pad group PG4.

The dummy sensor pads may be disposed between pad groups PG0 to PG4 to provide an electrical shielding effect. However, since the number of sensor pads TP0 to TP14 is odd, the dummy sensor pads need not be disposed between a portion of pad groups PG3 and PG4.

Referring to FIG. 9, the sensor pads TP0 to TP14 may provide pad groups PG0 to PG2. Each of the pad groups PG0 to PG2 may include three signal sensor pads. To output image data in the single-ended signaling scheme, each of the pad groups PG0 to PG2 may include three signal sensor pads adjacent to each other. For example, the first pad group PG0 may include three signal sensor pads TP1, TP2, and TP3 outputting image data and disposed adjacent to each other.

In the example embodiment illustrated in FIG. 9, since the image data is output in the single-ended signal scheme, there may be no additional clock pad group for outputting a clock signal. In addition, since the image data may be output to the nine signal sensor pads included in the three pad groups PG0 to PG2, the number of the signal sensor pads may be less than and the number of the dummy sensor pads may be greater than those in the example embodiment illustrated in FIG. 8.

Referring to FIG. 9, additional dummy sensor pads need not be disposed between the first ground sensor pad TP0 and the first pad group PG0. On the other hand, dummy sensor pads may be disposed between the second ground sensor pad TP14 and the second pad group PG2. However, since this is related to the example embodiment illustrated in FIG. 9, the dummy sensor pads need not be disposed between the second ground sensor pad TP14 and the second pad group PG2 in other embodiments. Alternatively, the dummy sensor pads may also be disposed between the first ground sensor pad TP0 and the first pad group PG0.

As described with reference to FIGS. 8 and 9, in an example embodiment, sensor pads TP0 to TP14 formed in a single image sensor may support first and second interfaces different from each other. The first interface may be an interface for outputting image data in a differential signaling scheme, and the second interface may be an interface for outputting image data in a single-ended signaling scheme. When the image sensor receives a control command, to output image data to the first interface, from an external device, the image sensor may set the sensor pads TP0 to TP14 as in the example embodiment illustrated in FIG. 8. On the other hand, when the image sensor receives a control command, to output image data to the second interface, from an external device, the image sensor may set the sensor pads TP0 to TP14 as in the example embodiment illustrated in FIG. 9. Thus, the versatility and expandability of the image sensor may be improved.

Setting of each of the sensor pads TP0 to TP14 may vary based on the first interface and the second interface. For example, one of the sensor pads TP0 to TP14 may be set as a signal sensor pad in the first interface and as a dummy sensor pad in the second interface. In the example embodiment illustrated in FIGS. 8 and 9, the fifth sensor pad TP4 may be set as a signal sensor pad in the first interface and as a dummy sensor pad in the second interface.

Another one of the sensor pads TP0 to TP14 may be set as a dummy sensor pad in the first interface and as a signal sensor pad in the second interface. In the example embodiment illustrated in FIGS. 8 and 9, the fourth sensor pad TP3 may be set as a dummy sensor pad in the first interface and as a signal sensor pad in the second interface.

Figure 10:
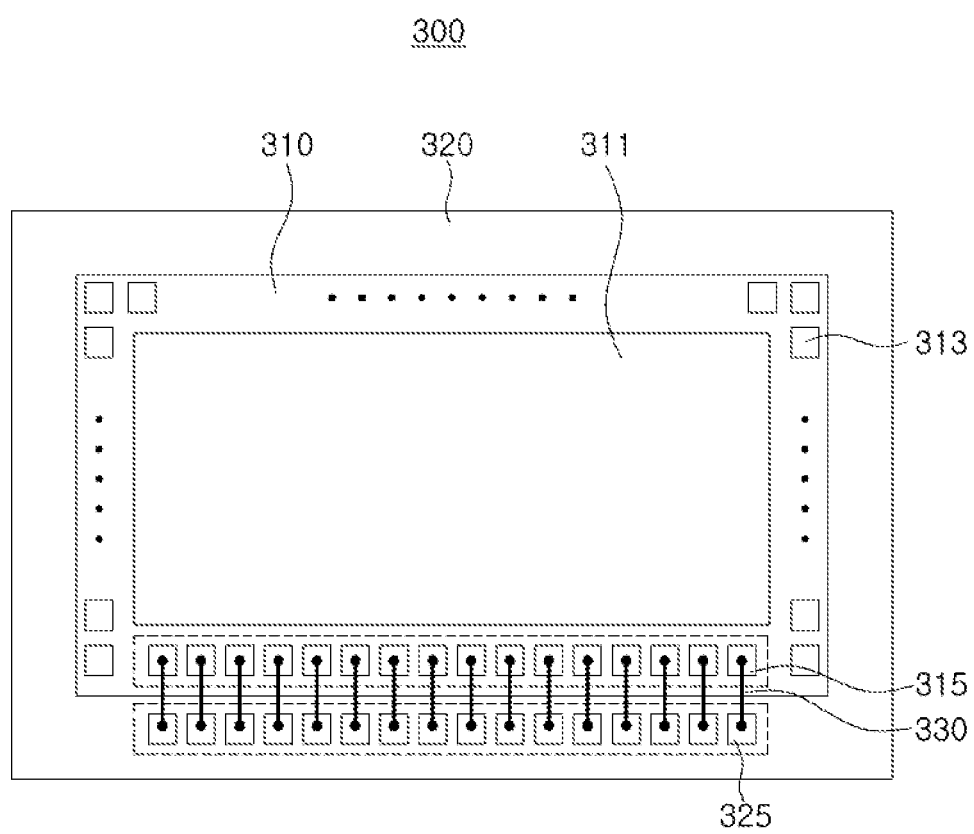
FIG. 10 is a schematic diagram of a sensor module including an image sensor according to an example embodiment.

FIG. 10 illustrates a sensor module including an image sensor according to an example embodiment.

Referring to FIG. 10, a sensor module 300 according to an example embodiment may include an image sensor 310, a first substrate 320 on which the image sensor 310 is mounted, and the like. The image sensor 310 may have a sensing area 311 in which pixels are disposed, and a plurality of sensor pads 313 may be disposed around the sensing area 311. A logic circuit, obtaining a pixel signal from pixels included in the sensing area 311 to output image data, may be disposed below the sensing area 311, and sensor pads 313 may be connected to the logic circuit.

Among the sensor pads 313, a sensor pad 315 outputting image data may be connected to substrate pads 325, formed on the first substrate 320, by a wire 230 or the like. However, a manner of connecting the sensor pads 315 and the substrate pads 325 is not limited to the connection by the wire 330.

In the sensor module 300 according to the example embodiment illustrated in FIG. 10, the image sensor 310 may include sixteen sensor pads 315 provided to output image data. The sixteen sensor pads 316 may be connected to the sixteen substrate pads 325 formed on the first substrate 320 in one-to-one correspondence.

The image sensor 310 may set a register value to determine an interface for outputting image data to an external device in response to a control command received from the external device, for example, a central processing unit (CPU), an application processor (AP), or the like. For example, the image sensor 310 may select one of a first interface for outputting image data in a differential signaling scheme and a second interface for outputting image data in a single-ended signaling scheme in response to a control command received from an external device. Setting of the sensor pads 315 may vary based on the first interface or the second interface. Hereinafter, the interfaces will be described with reference to FIGS. 11 and 12.

Figure 11:
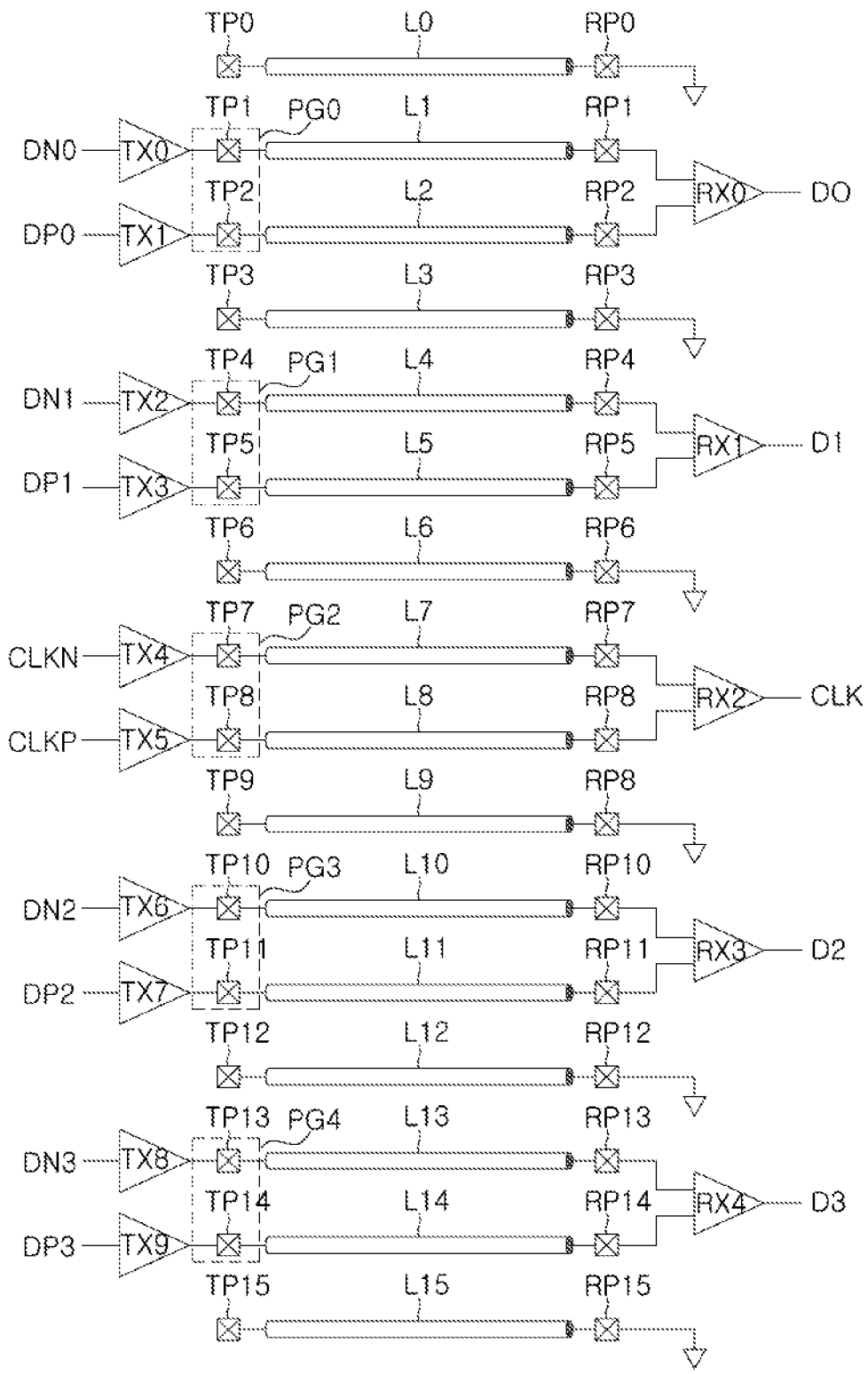
FIGS. 11 and 12 are circuit diagrams illustrating interfaces supported by a camera device according to an example embodiment, respectively.
Figure 12:
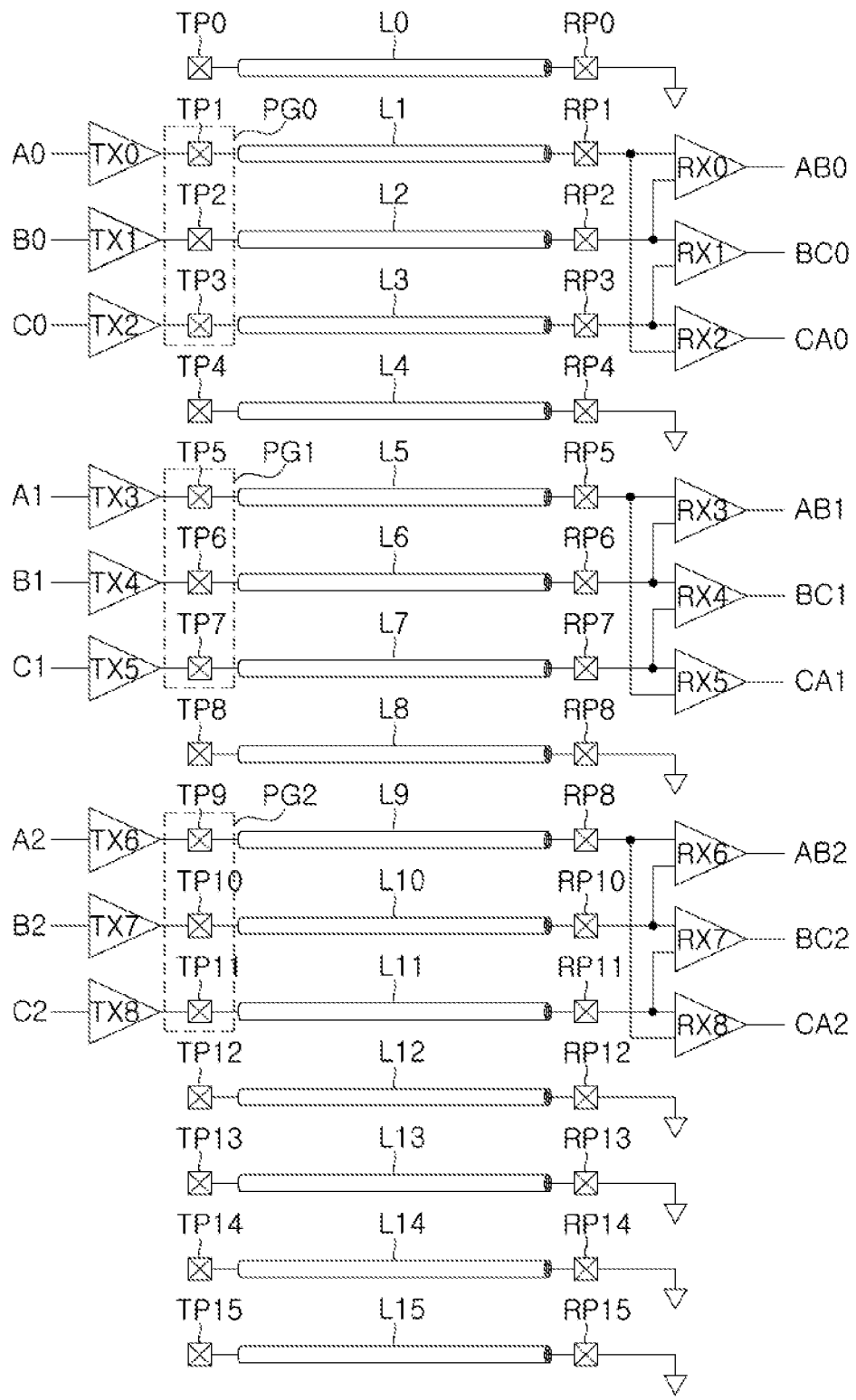

FIGS. 11 and 12 illustrate first and second interfaces supported by a camera device according to an example embodiment, respectively.

The example embodiment, illustrated in FIG. 11, may correspond to a case in which an image sensor selects the first interface for outputting image data in a differential signaling scheme, and the example embodiment, illustrated in 12 may correspond to a case in which an image sensor selects the second interface for outputting image data in a single-ended signaling scheme. As an example, the first interface may be a D-PHY interface, and the second interface may be a C-PHY interface. Similar to the description given with reference to FIGS. 8 and 9, transmitter pads TP0 to TP14 on a transmission side of data lanes L0 to L14 may be referred to as sensor pads of the image sensor.

Referring to FIGS. 11 and 12, among the sensor pads TP0 to TP14, sensor pads TP0 and TP14, disposed on opposite ends of the sensor pads TP0 to TP14, may include a first ground sensor pad TP0 and a second ground sensor pad TP14. A ground voltage for providing the first ground sensor pad TP and the second ground sensor pad TP14 may be input to an external device connected to the image sensor 210, for example, a central processing unit (CPU), an application processor (AP), or the like.

The sensor pads TP0 to TP14 may include signal sensor pads and dummy sensor pads disposed between the first ground sensor pad TP0 and the second ground sensor pad TP14. The image data may be output to the signal sensor pads in a differential signaling scheme or a single-ended signaling scheme, and need not be output to the dummy sensor pads. Similar to the ground sensor pads TP0 and TP14, the dummy sensor pads may receive a ground voltage or may be floated. The dummy sensor pads may provide an electrical shielding effect.

In the example embodiment illustrated FIG. 11, sensor pads TP0 to TP14 may provide pad groups PG0 to PG4. To output image data in the differential signaling scheme, each of the pad groups PG0 to PG4 may include a pair of signal sensor pads. In addition, at least one of the pad groups PG0 to PG4 may be allocated as a clock pad group PG2 outputting a clock signal. As an example, the clock signal CLK may be output through the clock pad group PG2 in a differential signaling scheme. The same number of pad groups may be disposed on opposite sides of the clock pad group PG2.

The pad groups PG0 to PG4 may include a first pad group PG0 adjacent to the first ground sensor pad TP0 and a second pad group PG4 adjacent to the second ground sensor pad TP14. Since the first ground sensor pad TP0 and the second ground sensor pad TP14 may provide an electric shielding effect, additional dummy sensor pads need not be disposed between the first ground sensor pad TP0 and the first pad group PG0 and between the second ground sensor between the pad TP14 and the second pad group PG4. The dummy sensor pads may be disposed between the pad groups PG0 to PG4 to provide an electrical shielding effect.

Referring to FIG. 12, the sensor pads TP0 to TP14 may provide pad groups PG0 to PG2. Each of the pad groups PG0 to PG2 may include three signal sensor pads adjacent to each other. In the example embodiment illustrated in FIG. 9, since the image data is output in a single-ended signaling scheme, there may be no additional clock pad group for outputting a clock signal. In addition, since image data may be output to nine signal sensor pads included in three pad groups PG0 to PG2, the number of the signal sensor pads may less than and the number of the dummy sensor pads may be greater than those in the example embodiment illustrated in FIG. 11.

Referring to FIG. 9, additional dummy sensor pads need not be disposed between the first ground sensor pad TP0 and the first pad group PG0. Meanwhile, two or more dummy sensor pads may be disposed between the second ground sensor pad TP14 and the second pad group PG2. However, this is only an example embodiment and, in other embodiments, dummy sensor pads need not be disposed between the second ground sensor pad TP14 and the second pad group PG2, or may also be disposed between the first ground sensor pad TP0 and the first pad group PG0.

As described with reference to FIGS. 11 and 12, in an example embodiment, the sensor pads TP0 to TP14, formed in a single image sensor, may support the first and second interfaces different from each other. The first interface may be an interface for outputting image data in the differential signaling scheme, and the second interface may be an interface for outputting image data in the single-ended signaling scheme.

Setting of each of the sensor pads TP0 to TP14 may vary based on the first interface and the second interface. For example, one of the sensor pads TP0 to TP14 may be set as a signal sensor pad in the first interface and as a dummy sensor pad in the second interface. In addition, another one of the sensor pads TP0 to TP14 may be set as a dummy sensor pad in the first interface and as a signal sensor pad in the second interface.

On the other hand, in the example embodiment illustrated in FIGS. 11 and 12, at least one of the sensor pads TP0 to TP14 may be set as a dummy sensor pad in both the first interface and the second interface. For example, unlike the embodiment of FIGS. 7 to 9 having one fewer sensor pads, the thirteenth sensor pad TP12 may optionally be set as a dummy sensor pad in both the first interface and the second interface.

Figure 13:
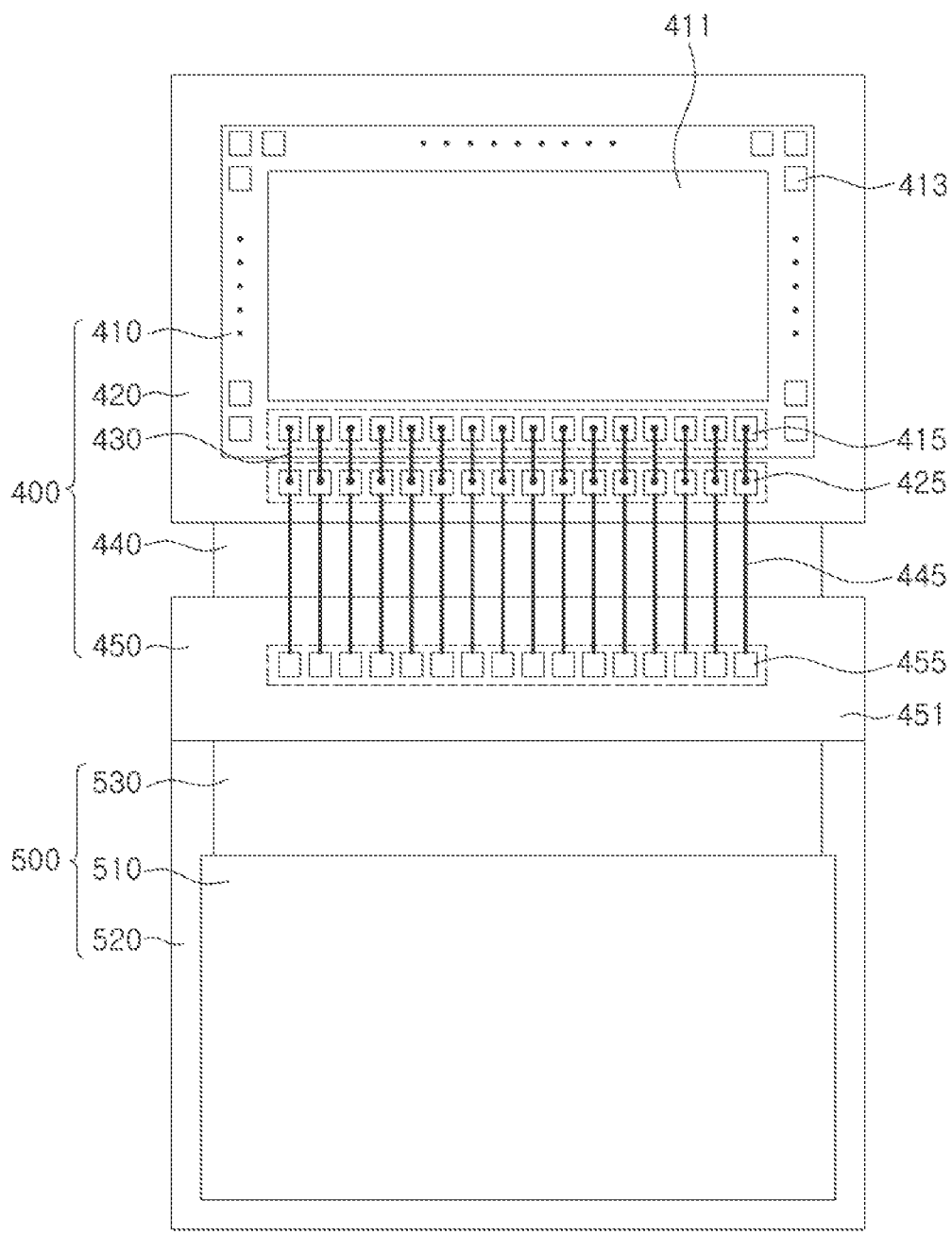
FIG. 13 is a schematic diagram of an electronic device according to an example embodiment.
Figure 14:
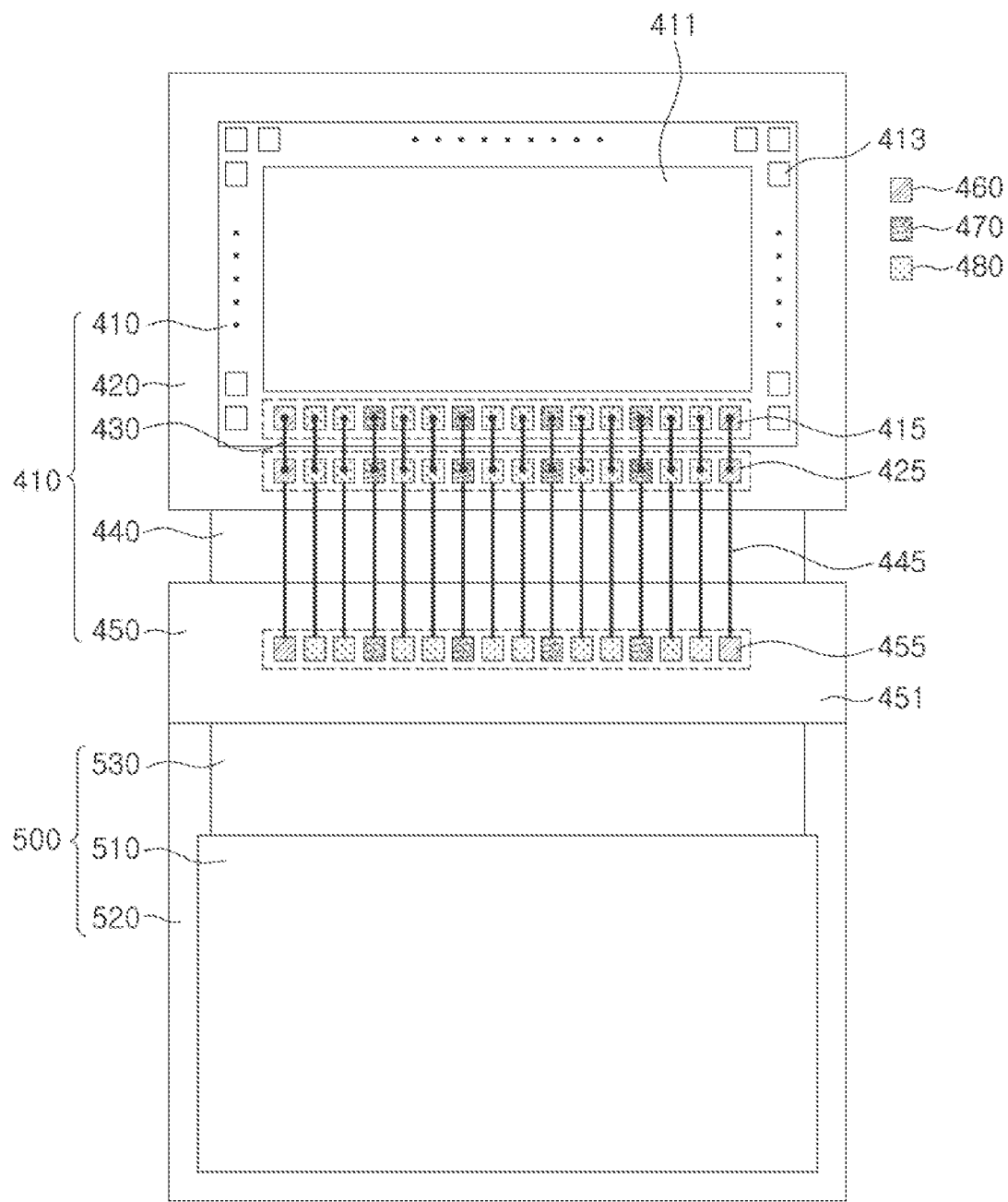
FIGS. 14 and 15 are schematic diagrams illustrating operations of an electronic device according to an example embodiment.
Figure 15:
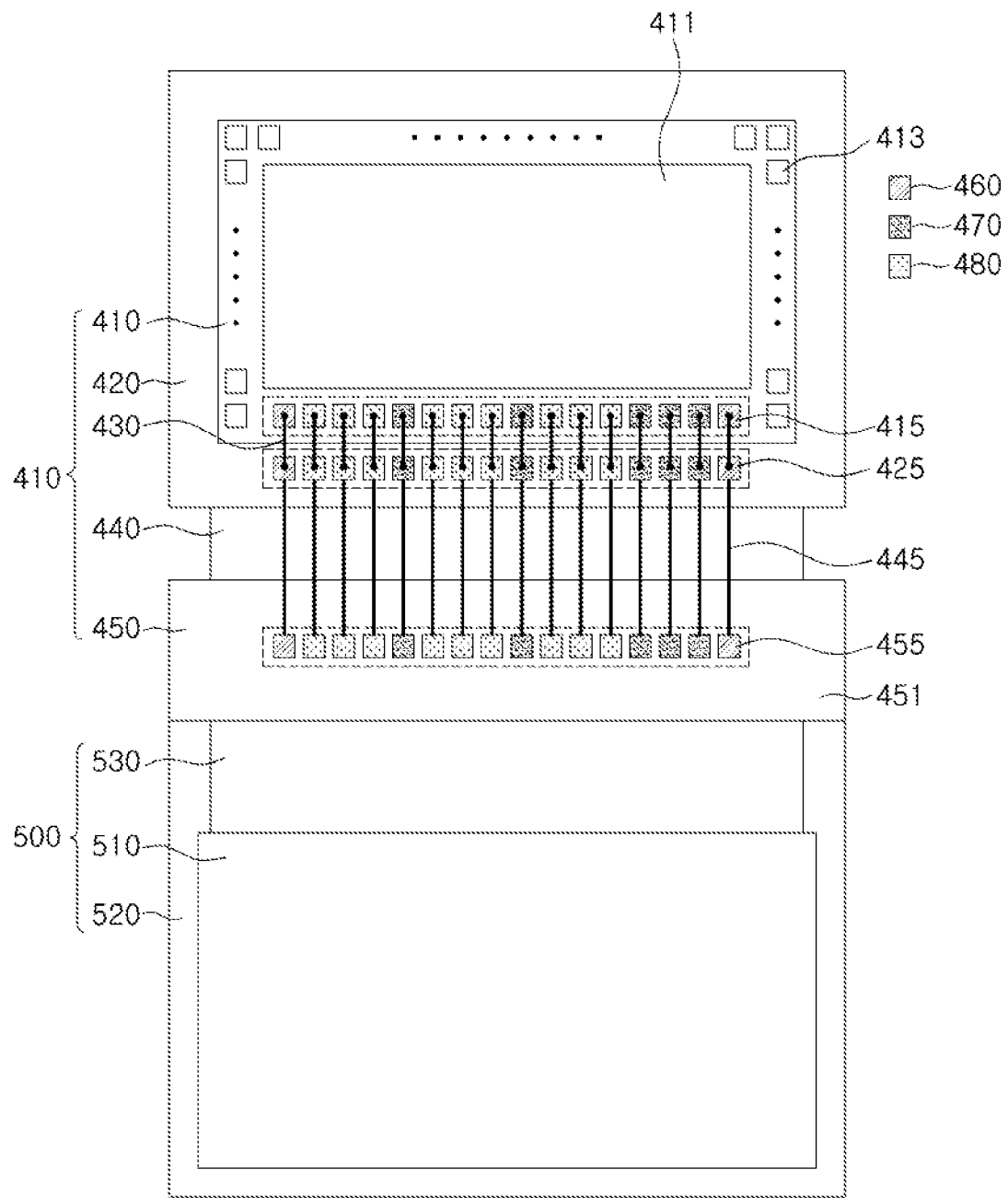

FIG. 13 is a schematic diagram of an electronic device according to an example embodiment. FIGS. 14 and 15 are diagrams illustrating operations of an electronic device according to an example embodiment.

Referring to FIG. 13, an electronic device according to an example embodiment may include a camera device 400 and a processor module 500. The camera device 400 may include an image sensor 410, a first substrate 420 on which the image sensor 410 is mounted, wires 430 electrically connecting the image sensor 410 and the first substrate 420 to each other, a second substrate 440 extending from the first substrate 420, a connector 450, and the like.

The connector 450 may include connection pads 455 for connecting the camera device 400 and the processor module 500 to each other, and the connection pads 455 may be disposed on the third substrate 451. The third substrate 451 may provide a module substrate together with the first substrate 420 and the second substrate 440. In an example embodiment, the second substrate 440 may be a flexible printed circuit board.

At least a portion of the first substrate 420, the second substrate 440, and the third substrate 451 may have a different stacked structure. As an example, the number of layers, included in the second substrate 440, may be less than the number of layers included in the third substrate 451. As an example, the number of layers, included in the second substrate 440, may be less than the number of layers included in the first substrate 420.

In an example embodiment, the number of layers included in the first substrate 420 may be equal to the number of layers included in the third substrate 451, without limitation. As an example, the first substrate 420 and the third substrate 451 may include a first layer in which a power supply line is disposed, a second layer, disposed below the first layer, in which a ground line is disposed, and a third layer, disposed below the second layer, in which signal interconnections for outputting image data are disposed, and a fourth layer, disposed below the third layer, in which a ground interconnection is disposed. However, the type and number of layers, included in each of the first substrate 420 and the third substrate 451, may be varied without limitation.

The image sensor 410 may have a sensing area 411 in which pixels are disposed, and a plurality of sensor pads 413 disposed around the sensing area 411. Among the sensor pads 413, at least a portion of the sensor pads 413 may be connected to the substrate pads 425 of the first substrate 420 by a wire 430, or the like, to output image data. The image data, output to the substrate pads 425, may be transmitted to the connection pads 455 through circuit interconnections 445 formed on the first substrate 420, the second substrate 440, and the third substrate 451.

The connection pads 455 may be connected to the processor module 500 physically connected to the connector 450. The processor module 500 may include a processor 510, a main substrate 520 on which the processor 510 is mounted, and the like. The main substrate 520 may include an interconnection area 530 connected to the connection pads 455 of the connector 450.

When the camera device 400 and the processor module 500 are connected and power starts to be supplied to the electronic device, the processor 510 may transmit a control command for setting an interface to the image sensor 410. As an example, the image sensor 410 may have a register for storing interface settings, and may set the value of the register as a register value based on a control command received from the processor 510. The image sensor 410 may set each of the sensor pads 415 to be one of a ground sensor pad, a signal sensor pad, or a dummy sensor pad based on the register value. Hereinafter, operations of the electronic device will be described with reference to FIGS. 14 and 15.

An example embodiment, illustrated in FIG. 14, may correspond to a case in which the image sensor 410 selects an interface for outputting image data in a differential signaling scheme. Referring to FIG. 14, each of the sensor pads 415 may be set to be one of a dummy sensor pad 460, a signal sensor pad 470, and a ground sensor pad 480.

The sensor pads 415 may be connected in one-to-one correspondence to substrate pads 425, formed on the first substrate 420, and connection pads 455 formed on the connector 450. Accordingly, the substrate pads 425 and the connection pads 455 may also be set as dummy, sensor or signal in accordance with the dummy sensor pad 460, the signal sensor pad 470, and the ground sensor pad 480 based on the setting of the corresponding sensor pads 415. When the setting of the sensor pads 415 is completed, the processor 510 may receive image data, generated by capturing a subject image by the image sensor 410, in a differential signaling scheme.

An example embodiment, illustrated in FIG. 15, may correspond to a case in which the image sensor 410 selects an interface for outputting image data in a single-ended signaling scheme. Referring to FIG. 15, each of the sensor pads 415 may be set to be one of a dummy sensor pad 460, a signal sensor pad 470, or a ground sensor pad 480. The placement order and the number of the dummy sensor pad 460 and the signal sensor pad 470 may vary, as compared with the example embodiment illustrated in FIG. 14, without limitation.

The sensor pads 415 may be connected to the substrate pads 425 formed on the first substrate 420 and the connection pads 455 formed on the connector 450 in a one-to-one correspondence. Accordingly, the substrate pads 425 and the connection pads 455 may also be set as dummy, sensor or signal in accordance with the dummy sensor pad 460, the signal sensor pad 470, and the ground sensor pad 480 based on the corresponding setting of the sensor pads 415. When the setting of the sensor pads 415 is completed, the processor 510 may receive image data, generated by capturing a subject by the image sensor 410, in a single-ended signaling scheme.

Figure 16:
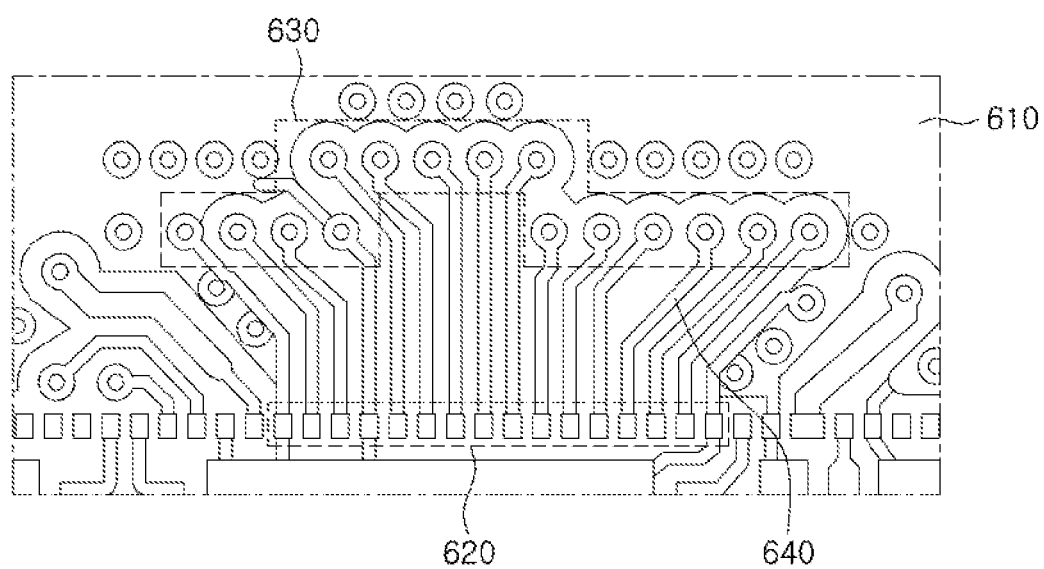
FIGS. 16, 17 and 18 are circuit board diagrams illustrating a relationship between pads based on an interface, in an image sensor according to an example embodiment.
Figure 17:
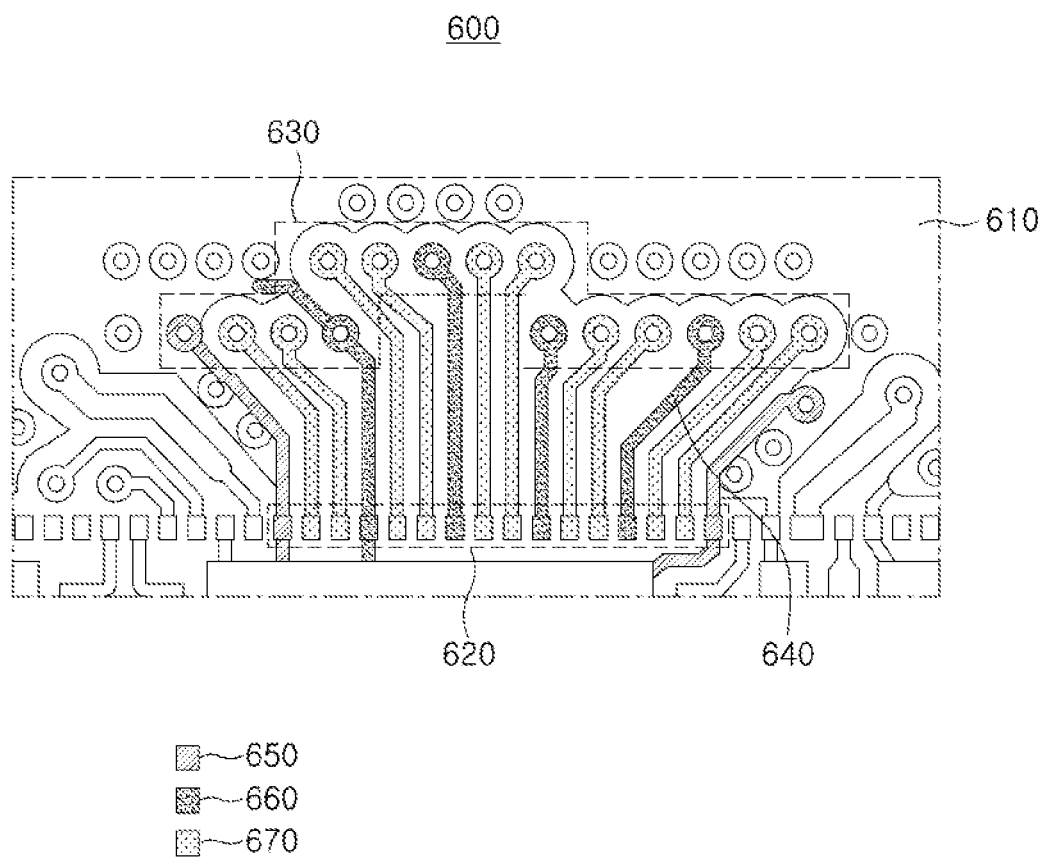
Figure 18:
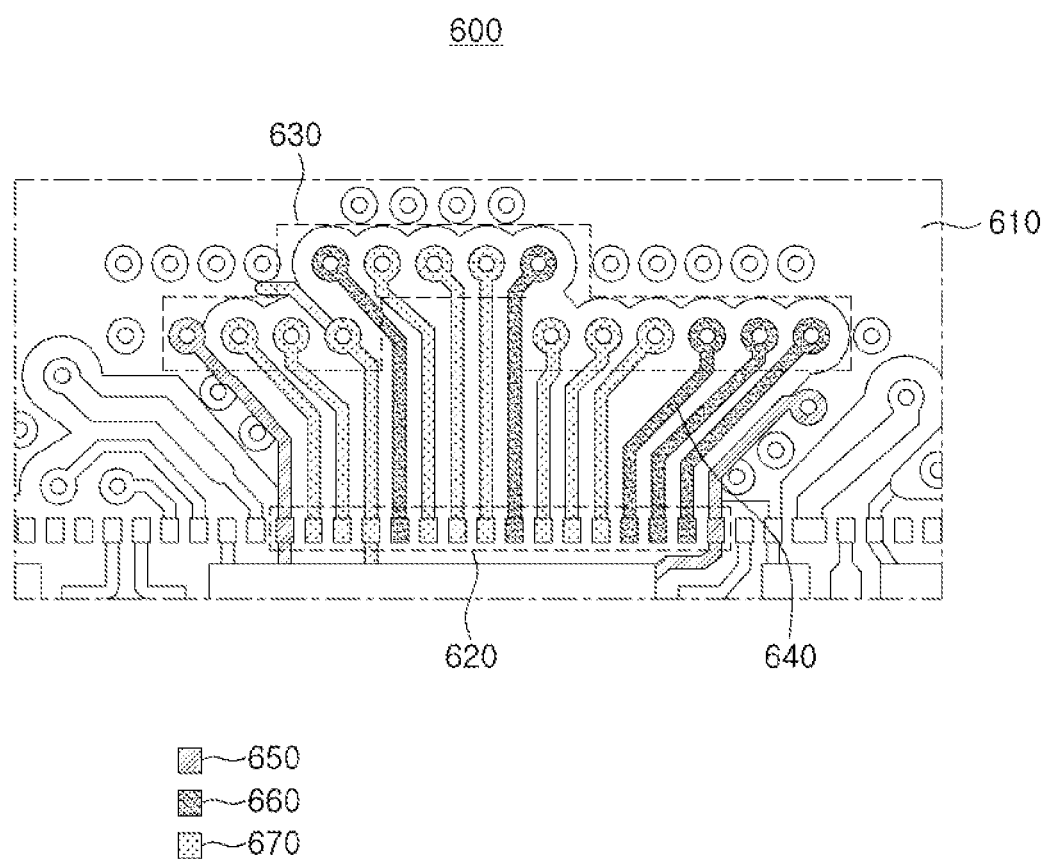

FIGS. 16 to 18 illustrate a circuit layout relationship between pads based on an interface, in an image sensor according to an example embodiment.

FIGS. 16 to 18 illustrate a portion of a module substrate 600 of a camera device including an image sensor. Referring to FIG. 16, the module substrate 600 may include a substrate body 610, input pads 620 connected to sensor pads of the image sensor, and output pads 630 connected to connection pads of a connector. Referring to FIG. 16, the input pads 620 and the output pads 630 may be connected to each other in one-to-one correspondence by conductive traces or wires 640. Thus, connection pads of the sensor pads of the image sensor and the connector may also be connected to each other in a one-to-one correspondence. The number of the input pads 620 illustrated in the drawings is sixteen, but is only an example and may be changed without limitation.

FIG. 17 illustrates an example embodiment in which an image sensor selects an interface for outputting image data in a differential signaling scheme. Referring to FIG. 17, among input pads 620, each of a pair of input pads, disposed on opposite ends of the input pads 620, may be allocated as a ground input pad 650. In addition, each of the input pads 620, disposed between the ground input pads 650, may be allocated as a dummy input pad 660 or a signal input pad 670. Image data or a clock signal may be output by a pair of signal input pads 670 adjacent to each other in the differential signaling scheme. The dummy input pads may be grounded or floating, without limitation.

FIG. 18 illustrates an embodiment in which an image sensor selects an interface for outputting image data in a single-ended signaling scheme. Referring to FIG. 18, among input pads 620, each of a pair of input pads disposed on opposite ends may be allocated to a ground input pad 650. In addition, each of the input pads 620 disposed between the ground input pads 640 may be allocated as a dummy input pad 660 or a signal input pad 670. Image data may be output in a single-ended signaling scheme by three signal input pads 670 adjacent to each other, and an additional clock signal need not be output.

Figure 19:
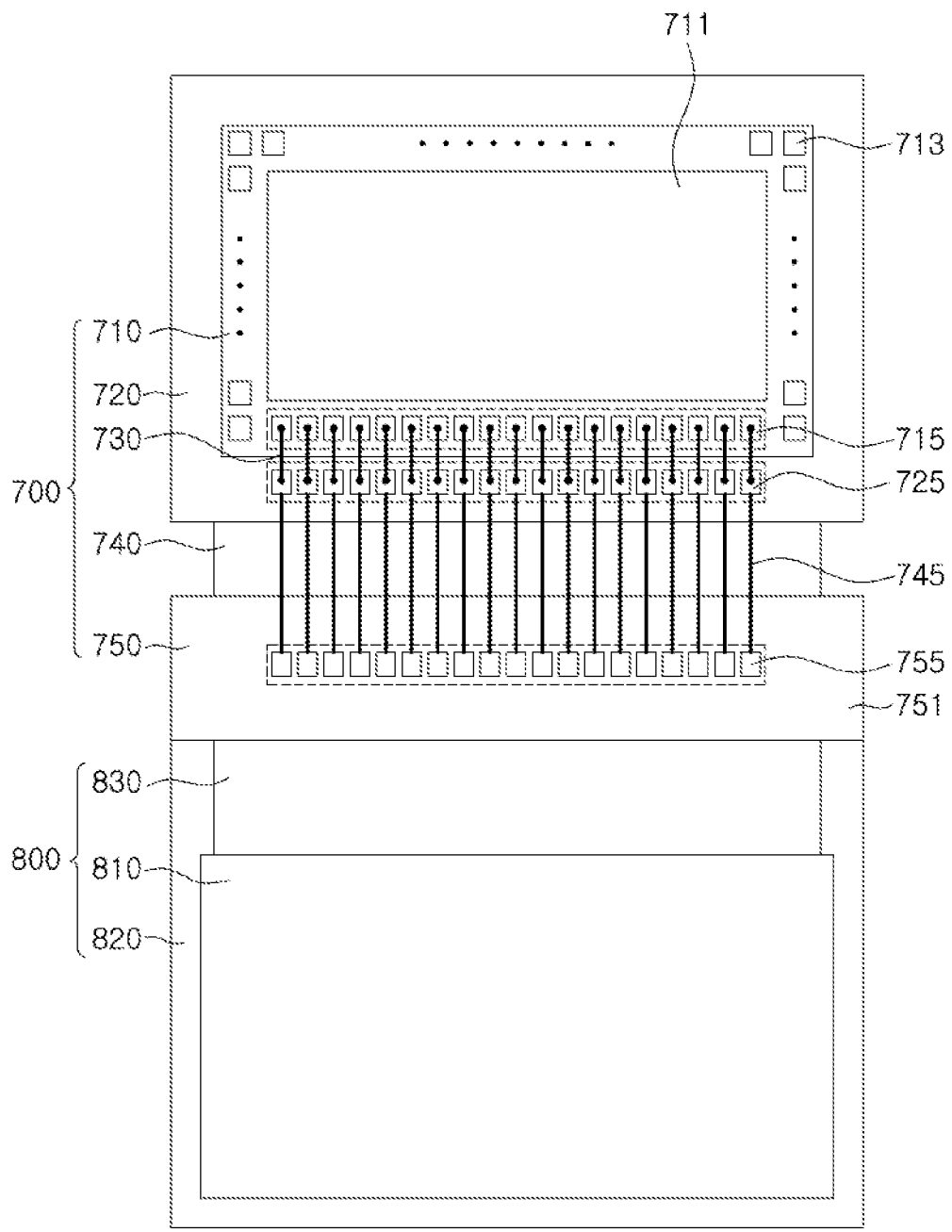
FIG. 19 is a schematic diagram of an electronic device according to an example embodiment.

FIG. 19 illustrates an electronic device according to an example embodiment.

Referring to FIG. 19, an electronic device according to an example embodiment may include a camera device 700 and a processor module 800. The camera device 700 may include an image sensor 710, a first substrate 720 on which the image sensor 710 is mounted, a wire 730 electrically connecting the image sensor 710 and the first substrate 720 to each other, a second substrate 740 extending from the first substrate 720, a connector 750, and the like.

The connector 750 may include connection pads 755 for connecting the camera device 700 and the processor module 800 to each other, and the connection pads 755 may be disposed on the third substrate 751. The third substrate 751 may provide a module substrate together with the first substrate 720 and the second substrate 740. In an example embodiment, the second substrate 740 may be a flexible printed circuit board. At least a portion of the first substrate 720, the second substrate 740, and the third substrate 751 may have a different stacked structure, which may be understood, for example, from the example embodiment described above with reference to FIG. 13, but is not limited thereto.

The image sensor 710 may have a sensing area 711 in which pixels are disposed, and a plurality of sensor pads 713 disposed around the sensing area 711. Among the sensor pad 715, at least a portion of sensor pads 715 may be connected to the substrate pads 725 of the first substrate 720 by the wire 730 to output image data. The image data, output to the substrate pads 725, may be transmitted to the connection pads 755 through circuit interconnections 745.

The connection pads 755 may be electrically connected to the processor module 800 connected to the connector 750. The processor module 800 may include a processor 810, a main substrate 820 on which the processor 810 is mounted, and the like. The main substrate 820 may include an interconnection area 830 electrically connected to the connection pads 755.

When the camera device 700 and the processor module 800 are connected and power starts to be supplied to the electronic device, the processor 810 may transmit a control command for setting an interface to the image sensor 710. As an example, the image sensor 710 may determine a register value from the control command, storing the interface setting as the register value of a register, based on the control command received from the processor 810. The image sensor 710 may set each of the sensor pads 715 to be one of a ground sensor pad, a signal sensor pad, and a dummy sensor pad based on the register value. Hereinafter, operations of the electronic device will be described with reference to FIGS. 20 to 25.

FIGS. 20 to 25 illustrate operations of an electronic device according to an example embodiment.

In an example embodiment illustrated in FIGS. 20 to 25, sensor pads 715 may further include power supply sensors 790 in addition to ground sensor pads 760, dummy sensor pads 770, and signal sensor pads 780. The power supply pads 790 may be pads for inputting or outputting a power supply voltage. In addition to a pair of ground sensor pads 760 disposed on opposite ends of the sensor pads 715, ground sensor pads 760 may be further disposed between some of the other pads. The power supply sensor pads 790 may be disposed alternately with the added ground sensor pads 760, or may be disposed between the added ground sensor pads 760.

Setting of the sensor pads 715 may vary based on type of the interface selected by the image sensor. For example, the setting of the sensor pads 715 in each of the operation examples illustrated in FIGS. 20 to 25 is summarized below by Table 1, but is not limited thereto.

TABLE 1

Figure 20:
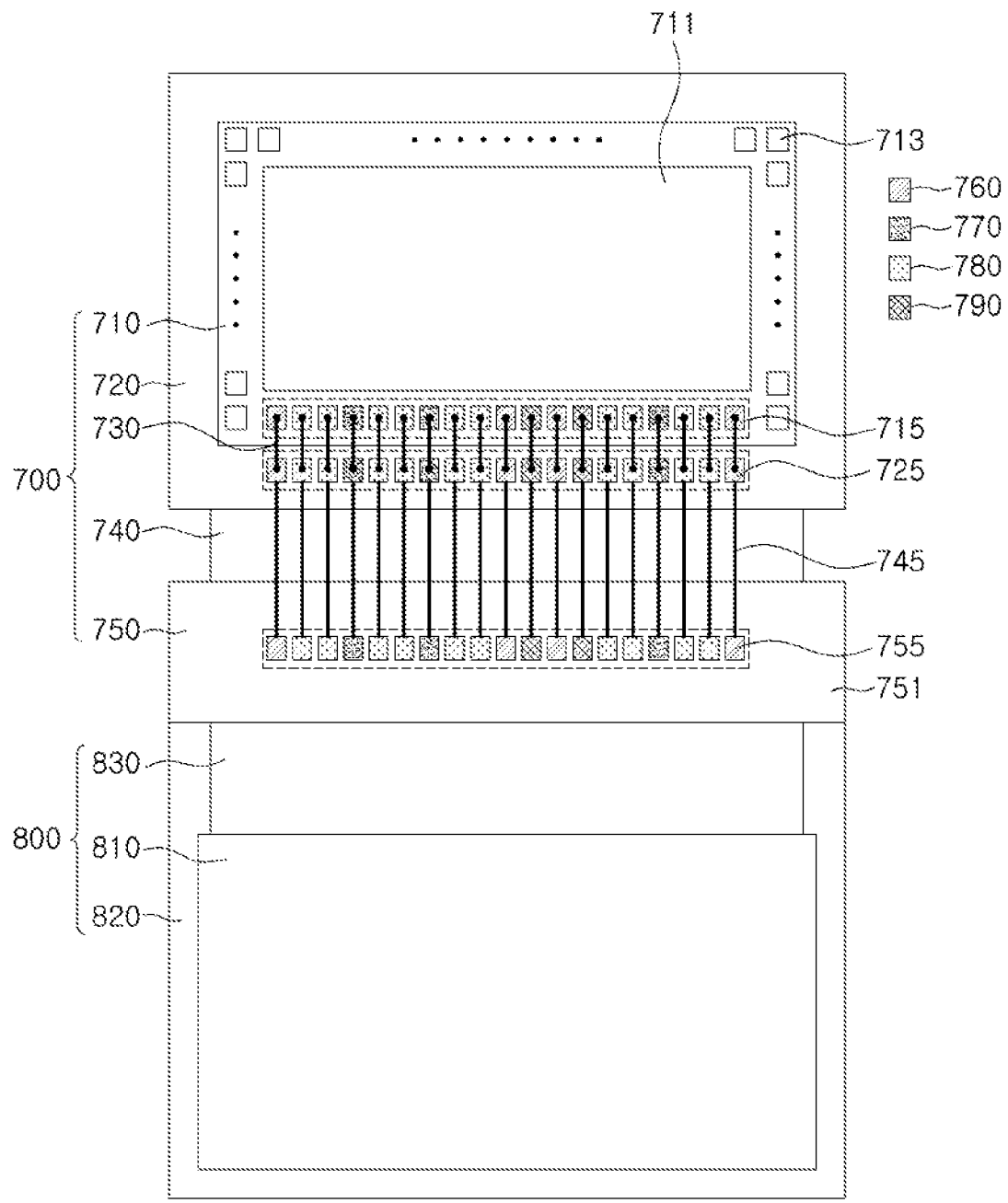
FIGS. 20, 21, 22, 23, 24 and 25 are schematic diagrams illustrating operations of an electronic device according to an example embodiment.
Figure 21:
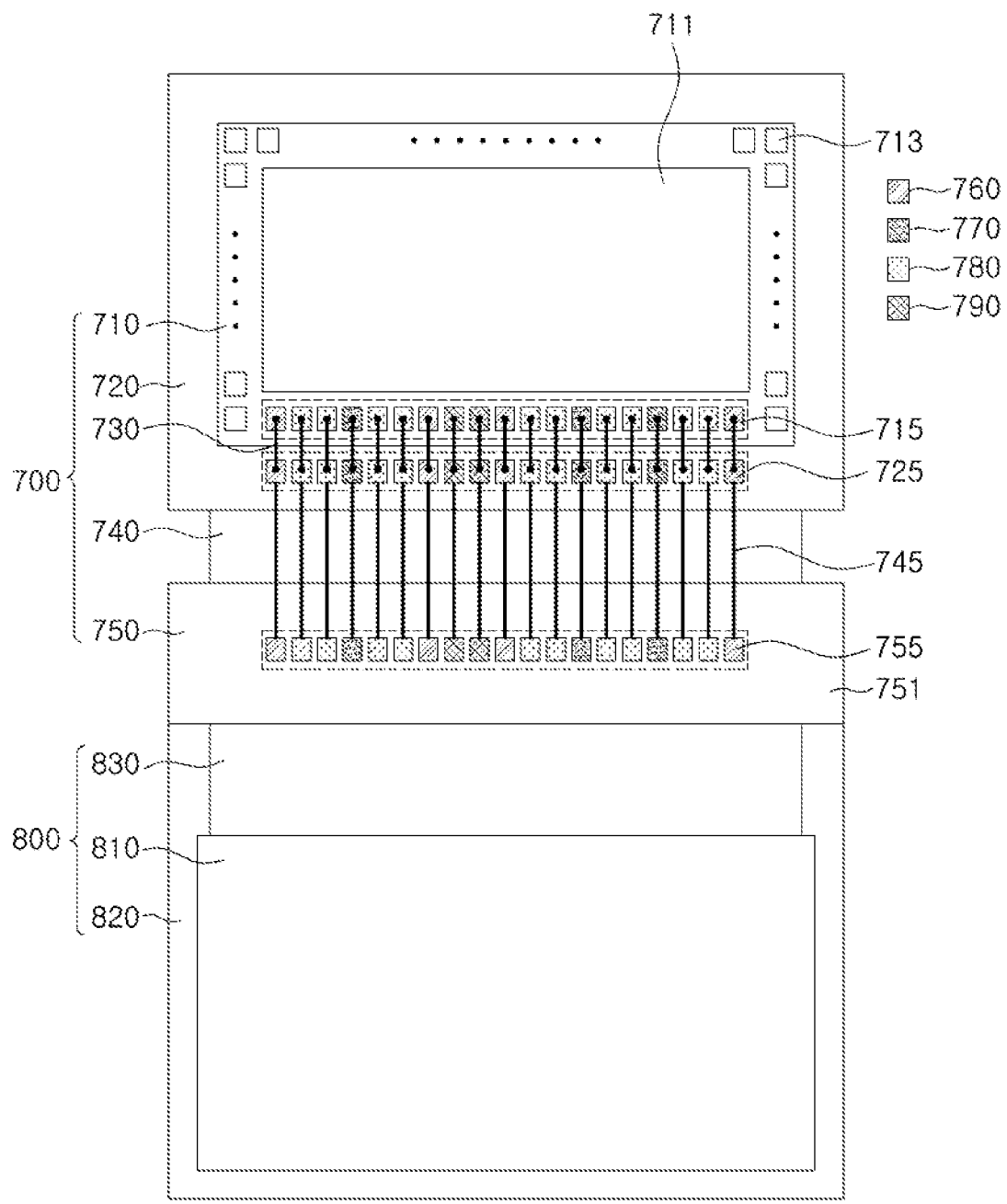
Figure 22:
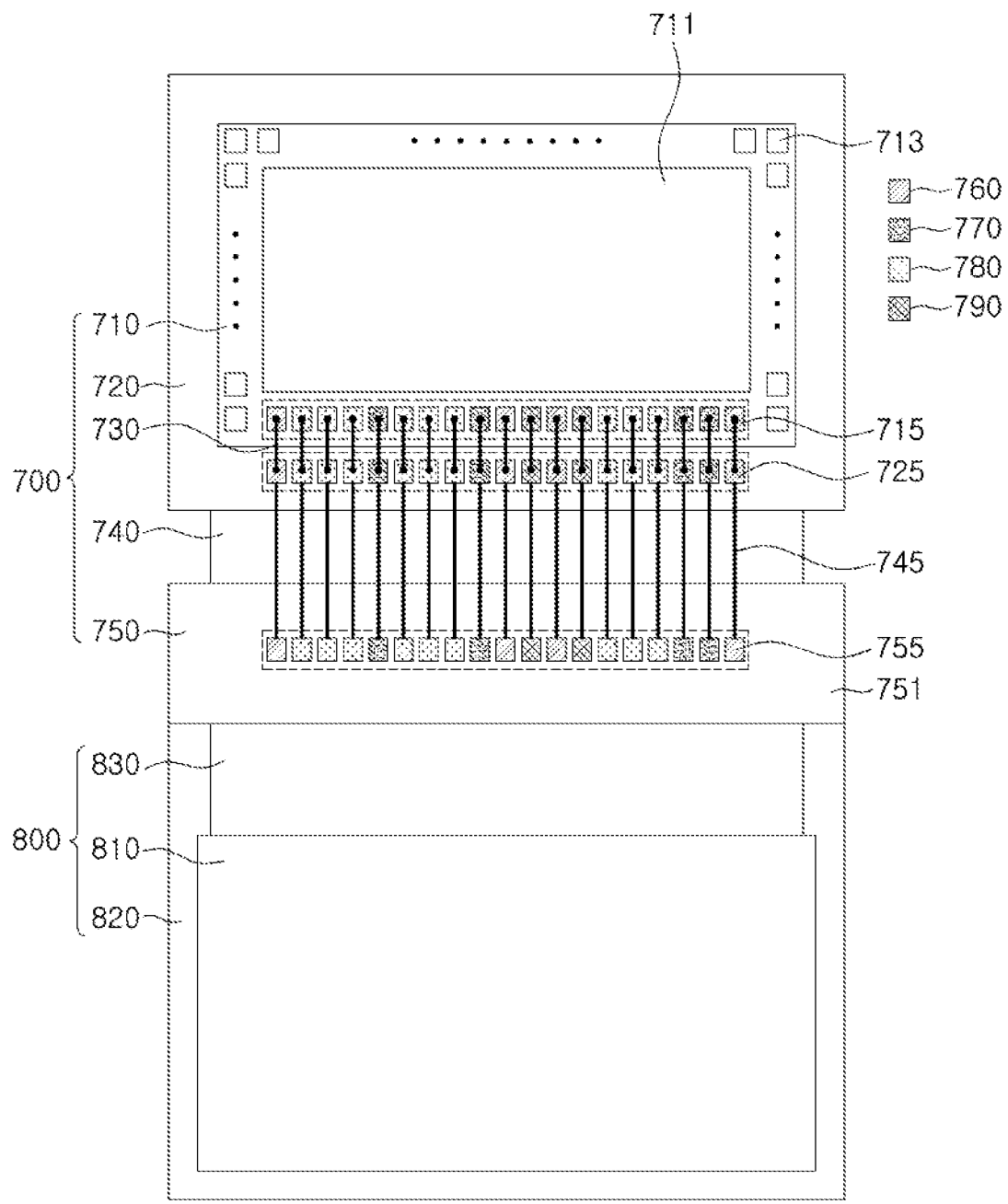
Figure 23:
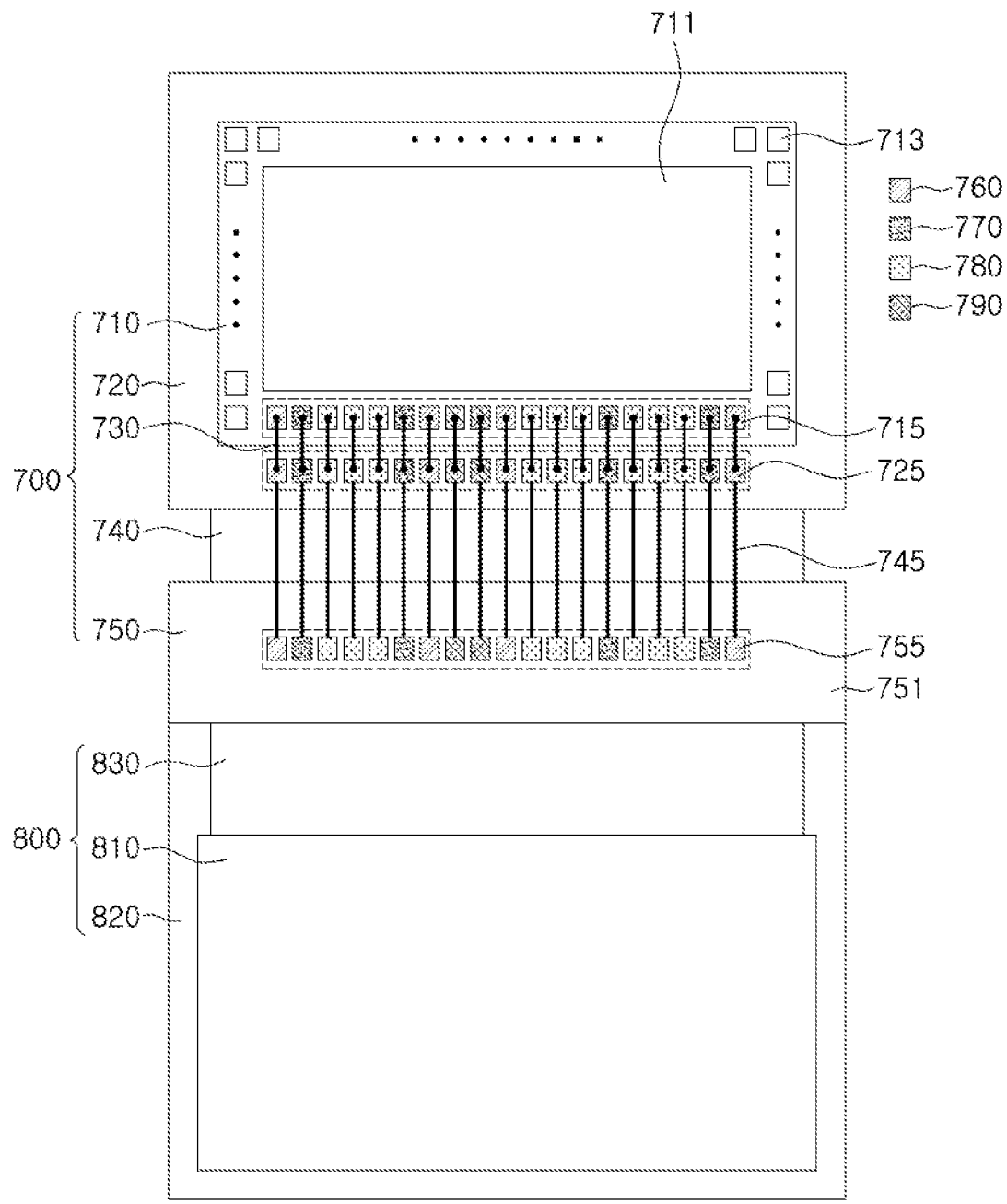
Figure 24:
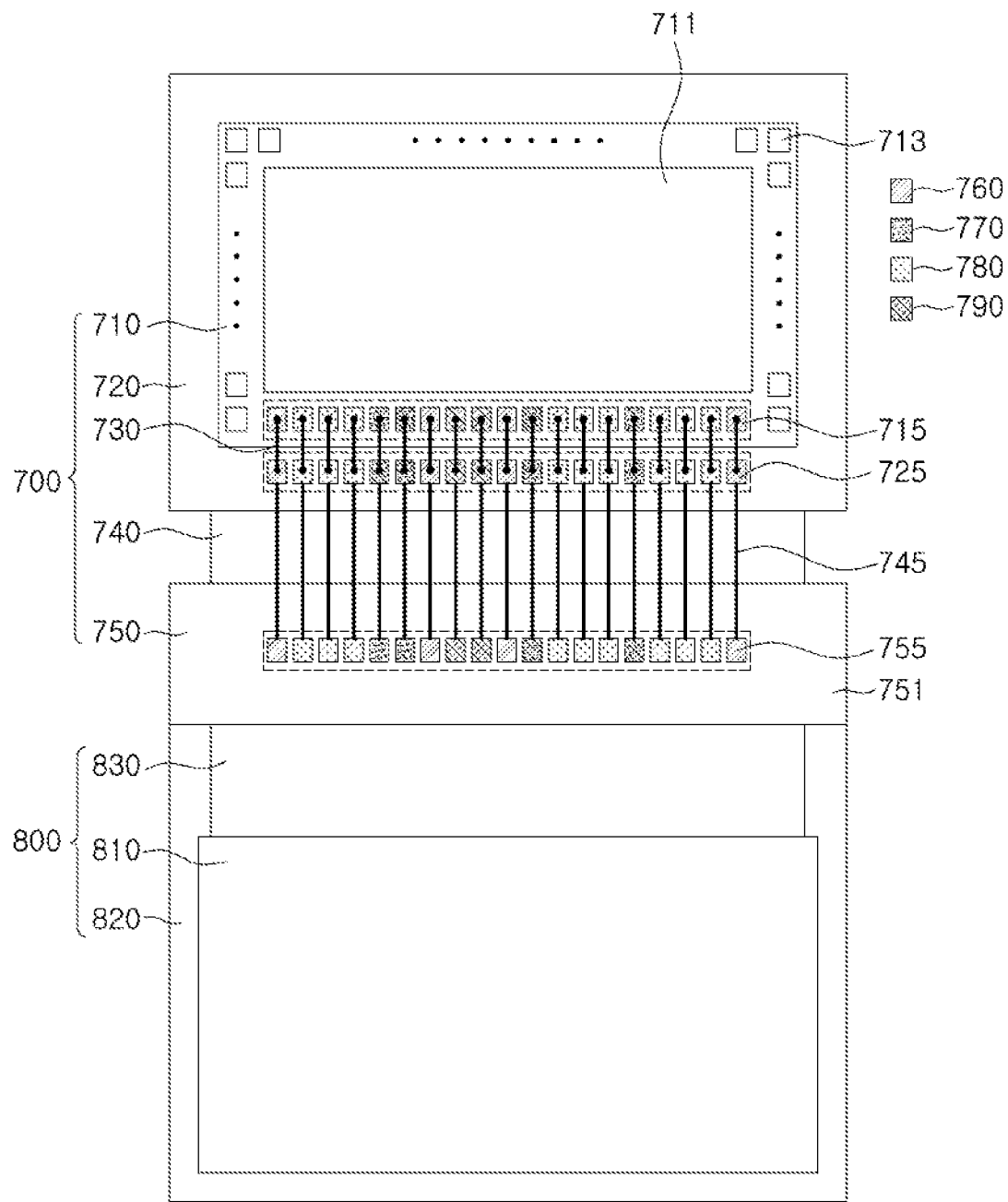
Figure 25:
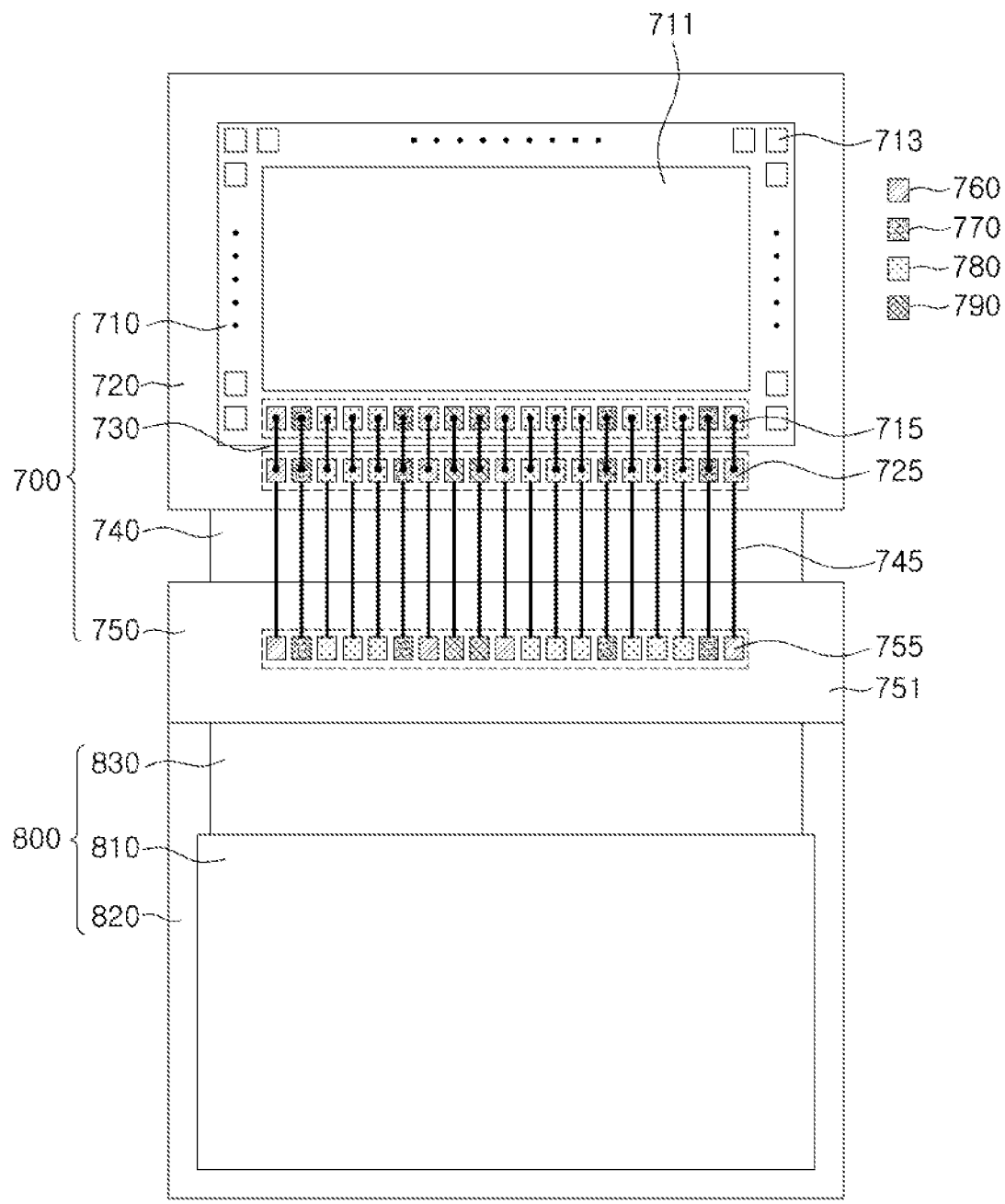

| Pad Order | FIG. 20 | FIG. 21 | FIG. 22 | FIG. 23 | FIG. 24 | FIG. 25 |
|---|---|---|---|---|---|---|
| 1 | GND | GND | GND | GND | GND | GND |
| 2 | DP2 | DP2 | A0 | DUMMY | C2 | DUMMY |
| 3 | DN2 | DN2 | B0 | A0 | B2 | C2 |
| 4 | DUMMY | DUMMY | C0 | B0 | A2 | B2 |
| 5 | DP0 | DP0 | DUMMY | C0 | DUMMY | A2 |
| 6 | DN0 | DN0 | A1 | DUMMY | DUMMY | DUMMY |
| 7 | DUMMY | GND | B1 | GND | GND | GND |
| 8 | CLKP | POWER | C1 | POWER | POWER | POWER |
| 9 | CLKN | POWER | DUMMY | POWER | POWER | POWER |
| 10 | GND | GND | GND | GND | GND | GND |
| 11 | POWER | CLKN | POWER | A1 | C1 | C1 |
| 12 | GND | CLKP | GND | B1 | B1 | B1 |
| 13 | POWER | DUMMY | POWER | C1 | A1 | A1 |
| 14 | DP1 | DN1 | A2 | DUMMY | DUMMY | DUMMY |
| 15 | DN1 | DP1 | B2 | A2 | C0 | C0 |
| 16 | DUMMY | DUMMY | C2 | B2 | B0 | B0 |
| 17 | DP3 | DN3 | DUMMY | C2 | A0 | A0 |
| 18 | DN3 | DP3 | DUMMY | DUMMY | DUMMY | DUMMY |
| 19 | GND | GND | GND | GND | GND | GND |

For example, since FIGS. 20 and 21 correspond to example embodiments in which an interface for outputting image data and a clock signal in a differential signaling scheme is selected, at least a pair of the signal sensor pads 780 may output clock signals CLKP and CLKN. However, as can be seen from Table 1, the setting of the sensor pads 715 may vary even in the same interface based on the differential signaling scheme. Referring to Table 1, the clock signals CLKP and CLKN may be output through eighth and ninth sensor pads in the example embodiment illustrated in FIG. 20, and the clock signals CLKN and CLKP may be output through eleventh and twelfth sensors in the example embodiment illustrated in FIG. 21. In the example embodiment illustrate in FIG. 20, the power supply sensor pads 790 may be disposed alternately with the ground sensor pads 760, while in the example embodiment illustrated in FIG. 21, the power supply sensor pads 790 may be disposed between the ground sensor pads 760.

Setting of a pair of sensor pads 715, disposed adjacent to each other to transmit image data or a clock signal in the differential signaling scheme, may also vary. As an example, a seventeenth sensor pad may output a positive data signal DP3 in the example embodiment illustrated in FIG. 20, and may output a negative data signal DN3 in the example embodiment illustrated in FIG. 22.

FIGS. 22 to 25 show embodiments in which image data is output in a single-ended signaling scheme. Therefore, the sensor pads 715 need not output an additional clock signal. As can be seen from Table 1, even in an interface using a single-ended signaling scheme, the image sensor 710 may set the sensor pads 715 in various manners. Referring to Table 1, a placement order of the ground sensor pads 760, the dummy sensor pads 770, the signal sensor pads 780, and the power supply sensor pads 790 may vary.

However, the setting of the sensor pads 715 in the example embodiment described with reference to FIG. 19 is not limited to that in the operation examples described with reference to Table 1 and FIGS. 20 to 25. A method of setting each of the sensor pads to locate the ground sensor pads 760, the dummy sensor pads 770, the signal sensor pads 780, and the power sensor pads 790 may be modified without departing from the scope of the present inventive concept as defined by the appended claims.

Figure 26:
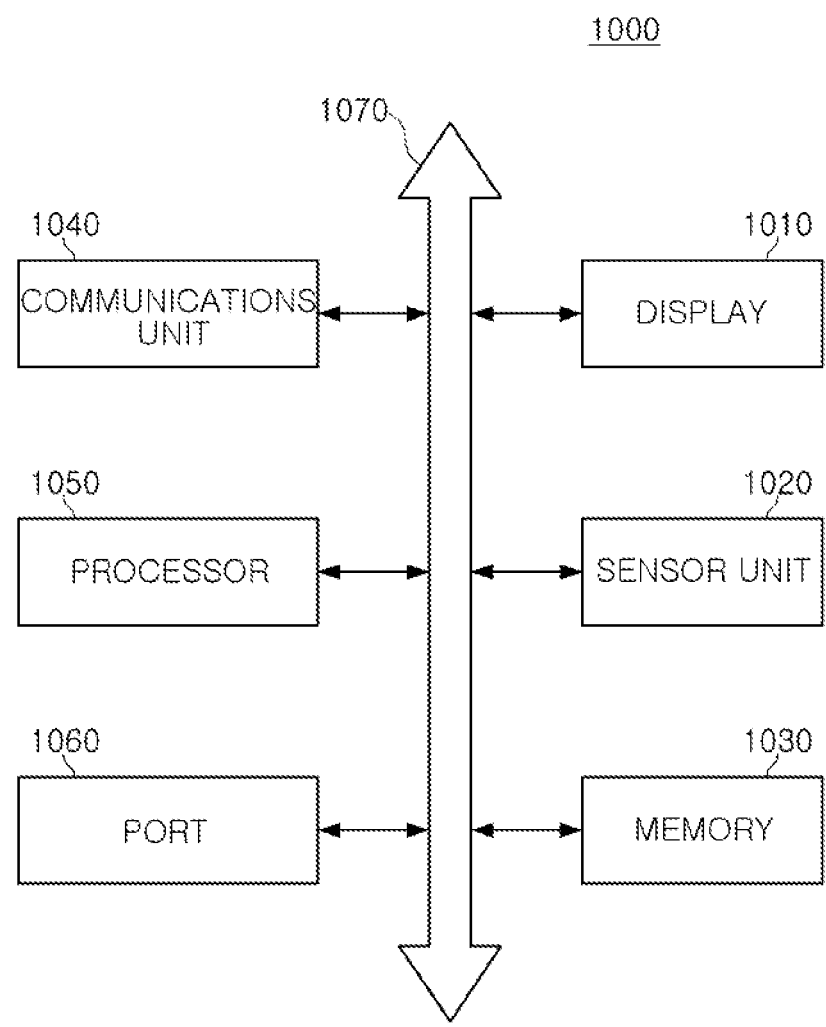
FIG. 26 is a schematic block diagram of an electronic device including an image sensor according to an example embodiment.

FIG. 26 illustrates an electronic device including an image sensor according to an example embodiment.

An electronic device 1000 according to an example embodiment illustrated in FIG. 26 may include a display 1010, a sensor unit 1020, a memory 1030, a communications unit 1040, a processor 1050, a port 1060, and the like. The electronic device 1000 may further include a power supply, an input/output device, and the like. Among the components illustrated in FIG. 26, the port 1060 may be provided for the electronic device 1000 to communicate with a video card, a sound card, a memory card, a USB device, and the like. The electronic device 1000 may be a concept including a smartphone, a tablet PC, a smart wearable device, and the like, other than a common desktop computer or a laptop computer.

The processor 1050 may perform a specific operation, command, and task, and the like. The processor 1050 may be a central processing unit (CPU), a microprocessor unit (MCU), or a microprocessor unit (MCU) and may communicate with the display 1010, the sensor unit 1030, memory 1030, and communications unit 1040, as well as other devices connected to the port 1050, through a bus 1070.

The sensor unit 1020 may include various sensors collecting surrounding information and may include, for example, an acoustic sensor, an image sensor, a GPS sensor, and the like. In the example embodiment illustrated in FIG. 26, the image sensor included in the sensor unit 1020 may be implemented as image sensors according to the example embodiments described above with reference to FIGS. 1 to 25, without limitation.

The memory 1030 may be a storage medium storing data necessary for operations of the electronic device 1000, multimedia data, or the like. The memory 1030 may include a volatile memory such as a random-access memory (RAM) or a nonvolatile memory such as a flash memory or the like. In addition, the memory 1030 may include at least one of a solid-state drive (SSD), a hard disk drive (HDD), and an optical disk drive (ODD), as a storage device.

As described above, according to example embodiments, a pad of an image sensor may be designed such that a single image sensor may support a plurality of interfaces that are different from each other. Accordingly, the image sensor and a processor may be connected to each other without changing a design of the pad based on type of an interface supported by a processor connected to the image sensor, and expandability and versatility of the image sensor may be extended.

Example embodiments have been disclosed herein, and although specific terms are employed, they are used and are to be interpreted in a generic and descriptive sense only and not for the purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of ordinary skill in the pertinent art that various changes in form and details may be made without departing from the scope or spirit of the present invention as set forth in the following claims and their equivalents.

What is claimed is:

1. A semiconductor-based image sensor comprising:
a pixel array having a plurality of pixels;
a logic circuit configured to process a signal output by each of the plurality of pixels to generate image data; and
a plurality of sensor pads connected to the logic circuit and configured to output the image data in an external device,
wherein the plurality of sensor pads comprises a first ground sensor pad, a second ground sensor pad, a plurality of pad groups disposed between the first ground sensor pad and the second ground sensor pad and configured to output the image data, each of the plurality of pad groups comprising at least two neighboring signal sensor pads, and a plurality of dummy sensor pads disposed between the first ground sensor pad and the second ground sensor pad and configured not to output the image data, and
wherein at least one of the plurality of dummy sensor pads is disposed between at least two of the plurality of pad groups.

2. The image sensor of claim 1, wherein:
each of the plurality of sensor pads is configured with a respective data lane in a one-to-one correspondence,
each of the plurality of sensor pads is controllably allocated as a signal sensor pad or dummy sensor pad based on a value of a register determining an interface.

3. The image sensor of claim 1, wherein the at least one of the plurality of dummy sensor pads is disposed closest to each of the at least two of the plurality of pad groups.

4. The image sensor of claim 1, wherein each of the plurality of pad groups comprises a pair of signal sensor pads adjacent to each other among the plurality of signal sensor pads, and the pair of signal sensor pads output a differential signal.

5. The image sensor of claim 4, wherein the plurality of pad groups comprises a clock pad group configured to output a clock signal, and at least one other pad group.

6. The image sensor of claim 5, wherein the at least one other pad group includes a number of other pad groups disposed on a first side of the clock pad group and an equal number of other pad groups disposed on a second side of the clock pad group.

7. The image sensor of claim 4, wherein the plurality of pad groups comprises a first pad group adjacent to the first ground sensor pad and a second pad group adjacent to the second ground sensor pad.

8. The image sensor of claim 1, wherein each of the plurality of pad groups comprises three signal sensor pads adjacent to each other among the plurality of signal sensor pads, and the three signal sensor pads each output a single-ended signal.

9. The image sensor of claim 8, wherein the plurality of pad groups comprises a first pad group adjacent to the first ground sensor pad and a second pad group adjacent to the second ground sensor pad, and at least two of the plurality of dummy sensor pads are disposed between the second pad group and the second ground sensor pad.

10. The image sensor of claim 9, wherein each of the plurality of dummy sensor pads is not disposed between the first pad group and the first ground sensor pad.

11. A camera device comprising:
a sensor module comprising an image sensor having a plurality of sensor pads, and a first substrate on which the image sensor is mounted; and a connector comprising a second substrate, connected to the sensor module, and a plurality of connection pads connected to the second substrate, wherein the plurality of connection pads comprises a first ground connection pad, a second ground connection pad, a plurality of signal connection pads disposed between the first ground connection pad and the second ground connection pad and configured to output image data from the image sensor, and at least one dummy connection pad configured not to output image data, wherein a number of the plurality of sensor pads is equal to the number of the plurality of connection pads, and the plurality of sensor pads and the plurality of connection pads are electrically connected in one-to-one correspondence, wherein the plurality of sensor pads comprises a first ground sensor pad connected to the first ground connection pad, a second ground sensor pad connected to the second ground connection pad, a plurality of pad groups disposed between the first around sensor pad and the second ground sensor pad and connected to the plurality of signal connection pads, and at least one dummy sensor pad connected to the at least one dummy connection pad, and wherein each of the plurality of pad groups comprises at least two neighboring signal sensor pads, and the at least one dummy sensor pad is disposed between at least two of the plurality of pad groups.

12. The camera device of claim 11, wherein:
the at least one dummy connection pad is disposed between at least two of the plurality of connection pads,
the connector is connected to the second substrate and comprises a third substrate on which some of the plurality of connection pads are disposed,
the second substrate is a flexible printed circuit board (FPCB),
each of the plurality of sensor pads is configured with a respective data lane in a one-to-one correspondence, and
each of the plurality of sensor pads is controllably allocated as the at least one dummy connection pad based on a value of a register determining an interface.

13. The camera device of claim 12, wherein a number of layers included in the second substrate is less than a number of layers included in the third substrate.

14. The camera device of claim 13, wherein a number of layers included in the first substrate is equal to the number of layers included in the third substrate.

15. The camera device of claim 11, wherein a number of layers included in the second substrate is less than a number of layers included in the first substrate.

16. An electronic device comprising:
a camera device including an image sensor having a plurality of sensor pads, a module substrate on which the image sensor is mounted, and a connector having a plurality of connection pads connected to the sensor pads, the plurality of sensor pads comprising a plurality of signal sensor pads outputting image data from the image sensor, and a plurality of dummy sensor pads between at least two of the plurality of signal sensor pads; and
a processor connected to the camera device through the connector to communicate with the camera device and configured to receive the image data based on a first interface or a second interface,
wherein the image sensor determines a first pad among the plurality of sensor pads to be one of the plurality of signal sensor pads and a second pad, different from the first pad, to be one of the plurality of dummy sensor pads in the first interface, and determines the first pad to be one of the plurality of dummy sensor pads and the second pad to be one of the plurality of signal sensor pads in the second interface.

17. The electronic device of claim 16, wherein the first interface is a D-PHY interface, and the second interface is a C-PHY interface,
each of the plurality of signal sensor pads is configured with a respective data lane in a one-to-one correspondence,
each of the plurality of signal sensor pads is controllably allocated as one of the plurality of dummy sensor pads based on a value of a register determining an interface.

18. The electronic device of claim 16, wherein:
the image sensor determines a third pad, different from the first pad and the second pad, to be one of the plurality of dummy sensor pads in the first interface and the second interface, and
the third pad is disposed between at least two of the plurality of signal sensor pads in at least one of the first interface and the second interface.

19. The electronic device of claim 16, wherein the plurality of sensor pads and the plurality of connection pads are connected in one-to-one correspondence.

20. The electronic device of claim 16, wherein:
the processor generates a control command to configure an interface with the camera device to be one of the first interface or the second interface and transmits the control command to the camera device, and
the camera device sets a register value configuring the interface as the first interface or the second interface in response to the control command.

* * * * *